United States Patent [19]
Kim et al.

[11] Patent Number: 6,151,334
[45] Date of Patent: Nov. 21, 2000

[54] SYSTEM AND METHOD FOR SENDING MULTIPLE DATA SIGNALS OVER A SERIAL LINK

[75] Inventors: Sungjoon Kim, Seoul, Rep. of Korea; David D. Lee, Palo Alto, Calif.; Deog-Kyoon Jeong, Seoul, Rep. of Korea

[73] Assignee: Silicon Image, Inc., Sunnyvale, Calif.

[21] Appl. No.: 09/187,559

[22] Filed: Nov. 4, 1998

Related U.S. Application Data

[60] Division of application No. 08/664,136, Jun. 14, 1996, Pat. No. 5,835,498, and a continuation-in-part of application No. 08/539,816, Oct. 5, 1995, Pat. No. 5,999,571, and a continuation-in-part of application No. 08/646,450, May 7, 1996, Pat. No. 5,905,769.
[60] Provisional application No. 60/004,907, Oct. 6, 1995.

[51] Int. Cl.$^7$ ..................................................... H04J 3/16
[52] U.S. Cl. .......................... 370/468; 370/537; 370/542; 348/423
[58] Field of Search ................................... 370/526, 527, 370/528, 535, 536, 537, 509, 512, 470, 476, 522, 543, 465, 468, 542; 348/423, 429, 430, 434, 385, 387, 388; 375/365–368

[56] References Cited

U.S. PATENT DOCUMENTS

| | | | |
|---|---|---|---|
| 4,631,720 | 12/1986 | Koeck | 370/535 |
| 4,730,346 | 3/1988 | Jiang | 370/510 |
| 4,750,172 | 6/1988 | Hornumg et al. | 370/102 |
| 4,759,018 | 7/1988 | Buchner | 370/535 |
| 5,005,191 | 4/1991 | O'Connor et al. | 370/510 |
| 5,121,385 | 6/1992 | Tominaga et al. | 370/528 |
| 5,216,671 | 6/1993 | Nutter | 370/112 |
| 5,227,876 | 7/1993 | Cucchi et al. | 370/535 |
| 5,253,274 | 10/1993 | Janniello et al. | 370/528 |
| 5,523,795 | 6/1996 | Ueda | 348/480 |
| 5,550,589 | 8/1996 | Shiojiri et al. | 348/387 |
| 5,583,574 | 12/1996 | Tanaka et al. | 370/528 |

*Primary Examiner*—Chau Nguyen
*Assistant Examiner*—Soon-Dong Hyun
*Attorney, Agent, or Firm*—Fenwick & West LLP

[57] ABSTRACT

A system and method for sending multiple data signals over a serial link comprises an embedding unit and a removing unit coupled by a serial line. The embedding unit preferably receives a plurality of data streams, encodes the data streams and then merges the encoded data into a serial stream that is output across a serial line to the removing unit. The removing unit receives a serial stream of data, decodes the serial stream, and then separates the decoded serial stream into separate streams thereby reconstructing the streams input to the embedding unit. The encoding and transmission by the embedding unit and the receipt and decoding by the removing unit are completely transparent, the signals output by the removing unit are identical in timing and data content to the signals input to the embedding unit. The present invention also includes a method for transmitting a plurality of data streams over a signal line, and a method for generating a plurality of data streams from a serial sequence.

38 Claims, 20 Drawing Sheets

SYSTEM AND METHOD FOR SENDING MULTIPLE DATA SIGNALS OVER A SERIAL LINK

CROSS-REFERENCES TO RELATED APPLICATIONS

The present application is a divisional of U.S. patent application Ser. No. 08/664,136 filed Jun. 14, 1996, now U.S. Pat. No. 5,835,498 issued Nov. 10, 1998, which is a continuation-in-part of U.S. patent application Ser. No. 60/004,907, entitled "High-Speed Digital Video Signal Transmission System," filed on Oct. 6, 1995, which is incorporated herein by reference; a continuation-in-part of U.S. patent application Ser. No. 08/539,816 entitled "Transition-Controlled Digital Encoding and Signal Transmission System," filed on Oct. 5, 1995 now U.S. Pat. No. 5,999,571 issued Dec. 7, 1999, which is incorporated herein by reference; and a continuation-in-part of U.S. patent application Ser. No. 08/646,450 entitled "System And Method for High-Speed Skew-Insensitive Multi-Channel Data Transmission," filed on May 7, 1996 now U.S. Pat. No. 5,905,769 issued May 18, 1999, which is incorporated herein by reference. The present application also is related to U.S. Pat. No. 5,974,464, issued Oct. 26, 1999, entitled "High-Speed Digital Video Signal Transmission System," filed on Sep. 30, 1996, which is incorporated herein by reference.

BACKGROUND OF THE INVENTION

1. Field of the Invention

The present invention relates generally to digital communications and interface devices in computer systems. In particular, the present invention relates to a system and method for sending multiple data signals or streams over a serial line. Still more particularly, the present invention relates to a system and method for sending an isochronous data stream and one or more additional data streams over a serial link.

2. Description of the Background Art.

The use and proliferation of computers is well known. Recently, however, the use of computers for multimedia applications has drastically increased. Especially in the area of desktop computing, new multimedia applications (such as editing full motion video, still pictures, sound clips as well as other programs that combine audio input/output and video input/output) are demanding increasing computing power and bandwidth from interconnection resources. For example, a primary area where more bandwidth is needed is in the connection of computer systems to display devices. The standard resolution for graphics, even in the desktop environment, has dramatically increased the density of pixels as well as the number of colors and shades of gray. The bandwidth requirement for high resolution displays is extremely high, so high that typical interconnect systems are dedicated to refreshing the display data stream such that the entire data channel is available only to carry display video and control data. Furthermore, the blanking time required by certain display types (e.g. CRTs), makes a part of the available bandwidth not usable. Thus, there is a need for a digital communications interconnect structure that can provide the desired high speed and bandwidth.

A common approach to satisfying the increases in the required data transfer rates has been to increase the number of parallel lines used in interconnect structures. However, this approach has a number of shortcomings. First, increasing the number of parallel lines requires increased amounts of space for the interconnect structures such as connectors in addition to the increase in materials for signal lines and cables. Second, increasing the number of parallel lines increases the number of input/output pins for integrated circuits which further heightens an existing problem because of the computational capacity being added to such integrated circuits and the corresponding need for more input/output pins. Third, increasing the number of parallel lines and sending data at high speeds over such lines creates additional problems in the form of electromagnetic interference. Thus, the addition of more parallel signal lines cannot satisfy the need for additional bandwidth.

Therefore, there is a continuing need for a simple and reliable system and method for transmission of data at a high-speeds. This system and method should not require extensive hardware and be adaptable to a variety of different isochronous signals and data stream combinations that may need to be sent over a serial line.

SUMMARY OF THE INVENTION

The present invention overcomes the deficiencies and limitations of the prior art with a serial link system and method for sending an isochronous data stream and one or more additional data streams over a single serial line. The preferred embodiment of the serial link system advantageously eliminates the aforementioned problems with numerous high speed parallel data lines and is able to provide high speed data transfer at rates in excess of that needed for high resolution displays. The preferred embodiment of the system of the present invention comprises an embedding unit and a removing unit coupled by a serial line. The embedding unit preferably receives a plurality of data streams, encodes the data streams and then merges the encoded data into a serial stream that is output across a serial line to the removing unit. The removing unit receives a serial stream of data, decodes the serial stream, and then separates the decoded serial stream into separate streams thereby reconstructing the streams input to the embedding unit.

The embedding unit preferably comprises an encoder, a data buffer, a control code generator, a scheduler, a multiplexor and a parallel-to-serial converter. The encoder receives a plurality of data streams which it respectively encodes. The encoded signals are stored temporarily in the buffer if necessary before being sent to the multiplexor. The control code generator creates and provides to the multiplexor control code signals necessary for decoding and separating the multiple streams being merged for transmission over the serial line. The scheduler is coupled to receive the output of the encoder and is coupled to control which of the streams applied at the inputs of the multiplexor will be output to the parallel-to-serial converter. The parallel-to-serial converter receives parallel bits from the multiplexor and the converts them to a serial stream send on the serial line.

The removing unit preferably comprises a serial-to-parallel converter, a stream selector, a de-multiplexor, a data buffer and a decoder. The serial-to-parallel converter is coupled to the serial line to receive the serialized signal from the embedding unit. The serial-to-parallel converter preferably converts each word sent on the serial line to parallel form, and outputs the word to the stream selector and the de-multiplexor. The stream selector identifies words that are control characters and then controls the de-multiplexor so that the data output by the serial-to-parallel converter is routed to the corresponding input line of the decoder. The decoder receives each word from the de-multiplexor and decodes the word to restore it to its original form prior to encoding and transmission across the serial line.

The present invention also includes a method for transmitting a plurality of data streams over a signal line, and a method for generating a plurality of data streams from a serial sequence. The method for transmitting a plurality of data streams over a signal line preferably comprises the steps of: receiving a first data stream and a second; encoding the first and second data streams into coded words; transmitting a first control code over the signal line; transmitting the encoded words of the first data stream over the signal line; transmitting a second control code over the signal line; and transmitting the encoded words of the second data stream over the signal line. The method for generating a plurality of data streams from a serial sequence preferably comprises the steps of: converting a serial sequence of bits into a word; comparing the word to a set of predetermined control characters; routing the word to a decoder according to the predetermined control character; and decoding the word.

DETAILED DESCRIPTION OF THE PREFERRED EMBODIMENTS

Figure 1:
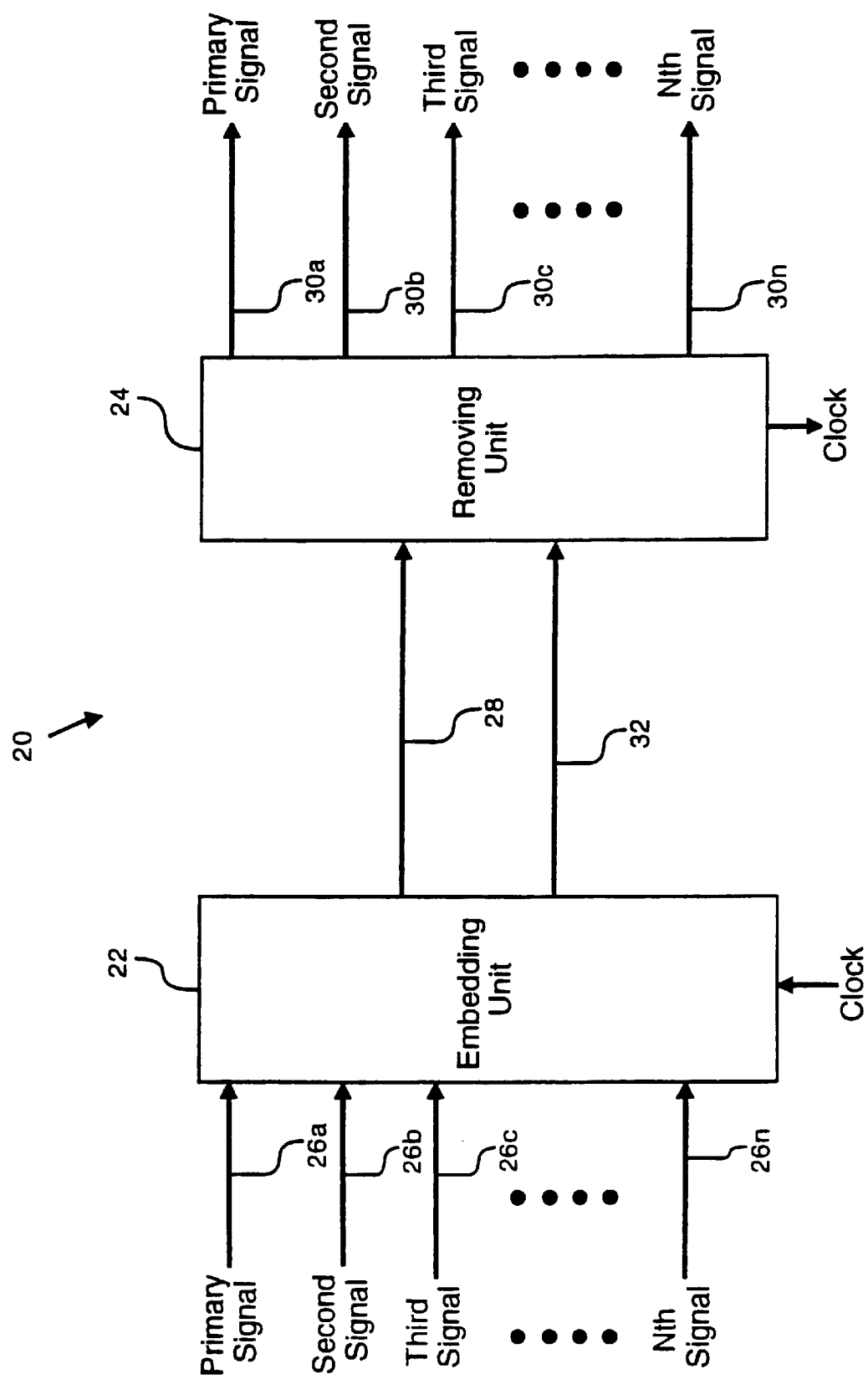
FIG. 1 is a block diagram of a preferred embodiment of a system of the present invention for sending and receiving multiple data streams over a serial link.

Referring now to FIG. 1, a block diagram of a preferred embodiment of a serial link system 20 for sending an isochronous digital data stream and one or more additional digital data streams over a single serial line is shown. The serial link system 20 of the present invention preferably comprises an embedding unit 22, a removing unit 24, a single serial line 28 and a clock signal line 32. This invention basically is a time multiplexed data transfer in a serial digital interface, for example a display interface. In a conventional parallel digital display interface, there are parallel video data refresh signals for each color (Red, Green, Blue) and video control signals (HSYNC, VSYNC, DE). However, in the present invention, multiple content of data streams as well as all video control signals, such as HSYNC, VSYNC, DE, are also sent through display data channels by employing line coding. While the preferred embodiment of the present invention will be described below in the context of a system that timeshares a serial data and clock line between four digital signals or streams, those skilled in the art will realize the present invention may be applied to a system having any number of streams from two streams to n streams.

The embedding unit 22 preferably has a plurality of inputs and a first and second outputs. Each of the plurality of inputs is coupled to a respective input signal line 26a, 26b, 26c, 26n to receive a primary signal, preferably a video signal, a second signal, a third signal and a nth signal. Each of the inputs and corresponding input signal lines 26a, 26b, 26c, 26n is a plurality of signal lines. For example, the primary signal line may be a video signal that has 8 signal lines for data (8 bits of Red, 8 bits of Green, 8 bits of Blue in sequence) and signal lines for a control signals (horizontal sync, vertical sync and other control signals); and the second signal may be an eight bit data signal requiring eight signal lines. Those skilled in the art will realize that the primary signal, second signal, third signal and nth signal may each require different numbers of signal lines and that a variety of combinations may be possible. The embedding unit 22 receives the primary signal, second signal, third signal and nth signal, and encodes each signal. Then the embedding unit 22 combines the encoded signals and inserts separation signals or characters for identifying the input signal from which the encoded signals were derived. The combination results in an encoded serial sequence that is output on the first output for transmission over the serial line 28. The second output of the embedding unit 22 provides a clock signal used to synchronize the transmission of the encoded sequence.

The removing unit 24 preferably has an first input, a second input and a plurality of outputs. The first input of the removing unit 24 is coupled to serial line 28 to receive the encoded serial sequence from the embedding unit 22. The second input of the removing unit 24 is coupled to clock line 32 to receive the clock signal from the embedding unit 22. The removing unit 24 separates the encoded serial sequence into separate signals, removes the separation characters and decodes the separate signals which are each output on a respective output of the removing unit 24. Each of the outputs of the removing unit 24 is coupled to a signal line 30a, 30b, 30c, 30n to output the reconstructed the primary signal, second signal, third signal and nth signal, respectively. Like the input signal lines 26a, 26b, 26c, 26n, each of the output signal lines 30a, 30b, 30c, 30n may be a plurality of signal lines. For example, the output signal lines 30a may be 25 parallel lines, the other output signal lines might be eight parallel lines. The present invention advantageously makes the embedding, transmission over the serial line 28 and clock line 32, and decoding appear completely transparent such that the signals applied to lines 26a–n are identical in content and relative timing to the signals that appear on the output lines 30a–30n.

Figure 2:
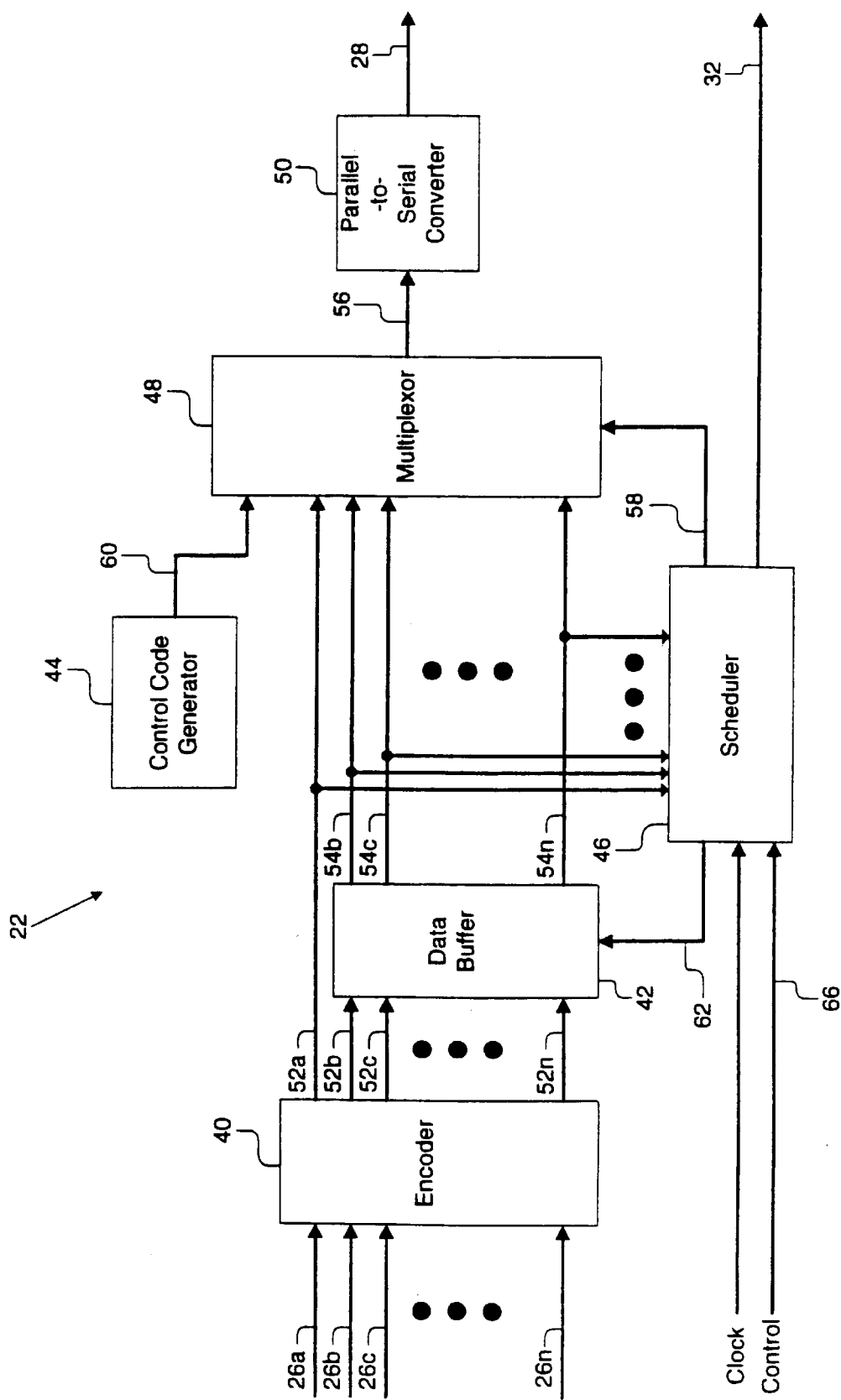
FIG. 2 is a block diagram of a first embodiment of the embedding unit of the system constructed according to the present invention.

Referring now to FIG. 2, a first and preferred embodiment of the embedding unit 22 is shown. The embedding unit 22 preferably comprises an encoder 40, a data buffer 42, a control code generator 44, a scheduler 46, a multiplexor 48 and a parallel-to-serial converter 50. For convenience and ease of understanding, the clock signal is shown as being input to scheduler 46 and output by the scheduler 46 on line 32. Those skilled in the art will realize that the clock signal is also applied to the other components of the embedding unit 22 in a conventional manner. The embedding unit 22 mixes various data streams into a single serial data stream. The present invention will now be discussed in the context of mixing various multimedia data streams into the display refresh data (primary stream) using the unused bandwidth of horizontal and vertical blanking periods. Possible multimedia data streams that can be mixed include, but are not limited to audio I/O, keyboard and mouse, I²C bus (serial bus for peripheral components), Universal Serial Bus and P1394 data. The separation between data streams is done by inserting special characters defined in a line coding scheme. By exploiting the available bandwidth of current high speed serial links, the present invention advantageously can send the coded stream such that embedding of multiple data streams is possible. In general, the embedding unit 22 receives a plurality of data streams. For each of the data streams, n bits of information to be transmitted are encoded to k bits, where k is larger than n, and then sent serially bit by bit over the serial line 28. $2^k$ data words can be defined using k bits. Since $2^n$ data words represented by n bit parallel data streams can be mapped into a subset of the $2^k$ data words, $2^k-2^n$ data words remain after mapping for use as special codes. Once the parallel streams have been encoded into k-bit words and other control words are created and inserted, the encoded words and control words are multiplex and serially sent on line 28 one bit at a time. For ease of understanding, the present invention will now be described in the context of encoding from eight bits to 10 bits, and decoding from 10 bits to eight bits although those skilled in the art will recognize that the present invention may be used for various other coding rates.

The encoder 40 preferably has a plurality of inputs and a plurality of outputs. The plurality of inputs are preferably grouped in sets. Thus, in FIG. 2, signal lines 26a, 26b, 26c, . . . 26n are each used to designate one or more signal lines of a data stream. For example, the first primary stream is preferably a video stream including the data and control signals for display refresh and may for example, be 28 parallel lines, 24 for data and 4 for control. The remaining signal lines 26b, 26c, . . . 26n can be used for other types of data, and are for example, each eight parallel lines. Those skilled in the art will realize that each signal line 26a, 26b, 26c, . . . 26n may be a variety of parallel signal lines. For each of the input signal lines 26a, 26b, 26c, . . . 26n, the encoder 40 preferably provides a corresponding output signal line 52a, 52b, 52c, . . . 52n. Each of the output signals line 52a, 52b, 52c, . . . 52n provides the encoded output of the signal applied to the corresponding input of the encoder 40. In the exemplary embodiment, the present invention uses an encoding scheme that encodes eight bits of data into a corresponding encoded 10-bit word. Thus, each of the output signals line 52a, 52b, 52c, . . . 52n is 10 parallel lines. The first output of the encoder 40 is preferably coupled by line 52a to an input of the multiplexor 48. The remaining output lines are 52b, 52c, . . . 52n are coupled to respective inputs of the data buffer 42. The encoder 40 preferably encodes the input stream into 10-bit output streams. The word output by the encoder 40 are preferably any 10-bit words other than those identified in Appendix A as special code words used as IDLE characters, isochronous data transfer characters, data stream separation characters, and link shut down characters. Any number of conventional eight to 10 encoding schemes may be used in addition to the specific encoding scheme identified below with respect to FIG. 5.

The data buffer 42 has a plurality of inputs and a plurality of outputs. Each of the inputs is coupled by a respective signal line 52b, 52c, . . . 52n to the outputs of the encoder 40. The encoded primary stream output by the encoder 40 on line 52a has priority in being multiplexed and transmitted serially, and therefore, is not buffered by the data buffer 42. However, the remaining encoded data streams output on lines 52b, 52c, . . . 52n may not be immediately usable by the multiplexor 48 and must be buffered. The data buffer 42 essentially stores the encoded words for the second through nth data streams until they can be inserted into portions of the serial channel not used by other streams. The data buffer 42 is preferably sized such that for each of the streams, it can hold n words, where n is the number of streams. This ensures that the data buffer can temporarily store data in the event it does output data from its corresponding steam to the serial link 28 except for every n clock cycles. The outputs of the data buffer 42 are coupled by a respective signal lines 55b, 55c, . . . 54n to the corresponding inputs of the encoder multiplexor 48. The data buffer 42 is also coupled to the scheduler via line 62 to receive control signals, as will be described in more detail below.

The control words used to separate data streams and for other control functions are provided by the control code generator 44. In the preferred embodiment, the control code generator 44 is a series of hard wired word or character values the each are coupled to a respective multiplexor input. The present invention provides a unique control and separation scheme in which four categories of special or control words are used. An exemplary set of control words are provided in Appendix A. The first type of control word is the IDLE word. The IDLE word is transmitted over the serial link 28 when there is not data from any of the data streams to be sent. The purpose of the idle word is to make enough transitions during preamble period so that the receiving circuit can obtain bit synchronization and to make the word synchronization easy. The second type of control word is the isochronous data transfer word. These control words indicate the transfer of time critical data such as timing control signals of video or other data. The isochronous special word can be sent at any time without interfering with the other streams. The third type of control word is a data stream separation word, which separates between multiple contexts of data streams and indicates the start or end of a certain type of data transfer. The fourth type of control word is the link shut down word, which is used when the embedding unit 22 shuts down and to let data recipients to know the end of data transmission. If the removing unit 24 receives link shutdown character, it can go into power down mode or idle state. Any special character selection which satisfies above conditions can be used for this invention. As have been noted above, a preferred implementation for the above encoding scheme is an 8 bit/10 bit encoding.

A selection of special characters for the 8 bit/10 bit encoding scheme will now be described in detail. The coding scheme advantageously makes the separation between normal data words and special control words easy, and thus leads to a great reduction of circuits. The present invention preferably divides special control words from normal data words by the number of transitions in a word frame. Since there are over a fixed number of transitions within a word frame, the frame can be classified into a special control word using only a simple counter and a comparator. Any special control word selection which satisfies the above conditions can be used for this invention. Appendix A shows an example selection of special control words for an 8 bit/10 bit encoding. In a 10 bit word boundary there can be as many as 9 data transitions. A word which has either more than 6 data transitions or 0 transitions within the word boundary is classified as a special control word.

The IDLE word preferably has the following characteristics. First, it has enough transitions for the removing unit 24 to obtain bit synchronization. Second, it is shift invariant for word synchronization. Third, it has an equal number of logical one bits and logical zero bits on average. Such balanced patterns are desirable, for example, when the signal path in the serial link 28 must include transformers for prevention of ground loops and common mode signal propagation. The 4 words shown in Appendix A, which have 8 data transitions within a 10 bit frame and are DC free and shift-invariant for each other, are defined as IDLE words. Anyone of the 4 words can be used. The inverted versions of the IDLE words can also be used. Word synchronization can be obtained easily by using these Words. If there are more than 15 data transitions within 2 frames, the receiver will obtain word synchronization.

Words with 6 data transitions are used as isochronous data transfer words and the data stream separation characters. Words starting with '0' and having 6 data transitions are used for isochronous data transfer. Words starting with '1' and having 6 data transitions are used for data stream separation information.

Words without a transition within its word boundary is used as link shut down characters.

Words which have from 1 to 5 data transitions are used as normal data characters.

As shown in FIG. 2, the scheduler 46 is responsible for controlling the data buffer 42 and the multiplexor 48. The scheduler 46 preferably has a plurality of inputs coupled via lines 52a, 54b, 54 c . . . 54n to receive the encoded words from the encoder 40 and the data buffer 42. The scheduler 46 has a first and a second output coupled vial lines 62 and 58, respectively to the data buffer 62 and the multiplexor 48. The scheduler 46 also has two additional inputs; a first input coupled to receive a clock signal, and a second input coupled via line 66 to receive control signals specifying whether to start up or shut down the serial link 28. The scheduler 46 controls which encoded signals are sent from the multiplexor 48 to the parallel-to-serial converter 50. The scheduler 46 preferably controls the signals output by the multiplexor 48 according to the following rules.

1) The isochronous data transfer words are input into the data stream output by the multiplexor 48 when receive and have the highest priority;
2) The encoded primary stream output on line 52a has the next highest priority and is selected for output by the multiplexor 48 if there are no isochronous data transfer words to be sent and after a data stream separation word for the primary stream has be sent;
3) The encoded second stream output from the data buffer 42 on line 54b has the next highest priority and is selected for output by the multiplexor 48 if there are no isochronous data transfer words or encoded primary stream data words to be sent and after a data stream separation word for the second stream has be sent;
4) The encoded nth stream output from the data buffer 42 on line 54n has the next highest priority and is selected for output by the multiplexor 48 if there are no isochronous data transfer words, encoded primary stream data words . . . or n–1 stream data words to be sent and after a data stream separation word for the nth data stream has be sent; and
5) If there are no data words or isochronous data transfer words to be sent, the scheduler 46 sends controls the multiplexor 48 such that an IDLE word is transmitted.

The multiplexor 48 preferably has a plurality of inputs and a plurality of outputs. The multiplexor 48 preferably is n 10-to-1 multiplexors. The multiplexor 48 receives a plurality of signals from the control code generator 44, the encoder 40 and the data buffer 42. Each of the signals is preferably 10 parallel bits. The multiplexor 48 provides one of the sets of 10 parallel bits at its output which is coupled by line 56 to the input of the parallel-to-serial converter 50. For each word received by the parallel-to-serial converter 50, it outputs the 10-bit words serially bit by bit over line 28.

Figure 3:
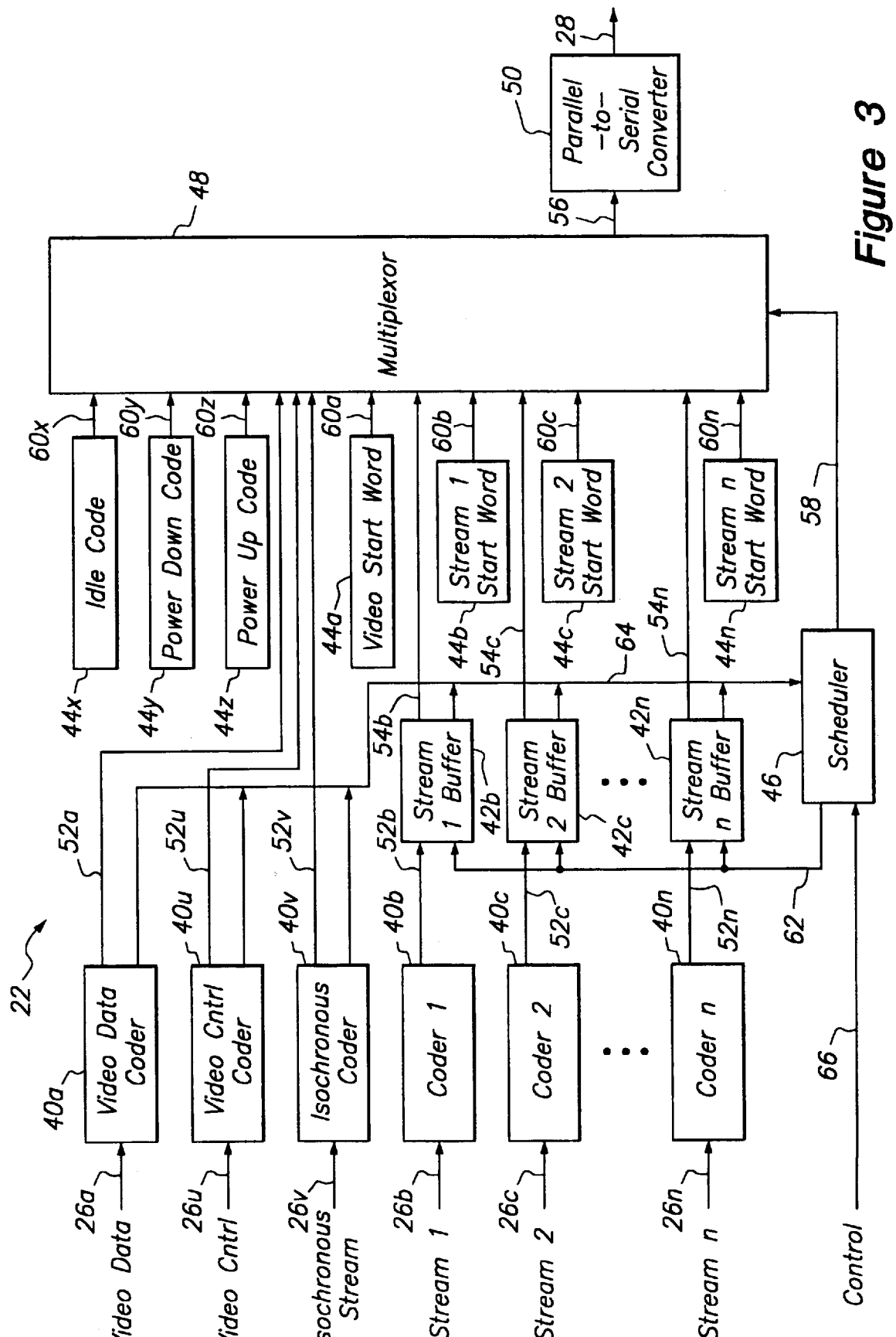
FIG. 3 is a block diagram of a second embodiment of the embedding unit of the system constructed according to the present invention.

Referring now to FIG. 3, a specific embodiment of the embedding unit 22 is shown in more detail. For ease of understanding and convenience, like parts have been labeled with like reference numerals. The specific embodiment shown in FIG. 3, is intended for use where the primary data stream includes video data, video control signals, and isochronous data stream; and the other data streams 1 to n are for additional multiplexed data that does not include isochronous information. The embodiment of the present invention shown in FIG. 3 is similar to the embodiment shown in FIG. 2, except that the encoder 40, data buffer 42 and control code generator 44 are replaced by a plurality of encoders 40a, 40b, 40c . . . 40n, 40u, 40v, a plurality of stream buffers 42b, 42c . . . 42n, and a plurality of control code generators 44a, 44b, 44c . . . 44n, 44x, 44y, 44z, respectively.

Figure 5:
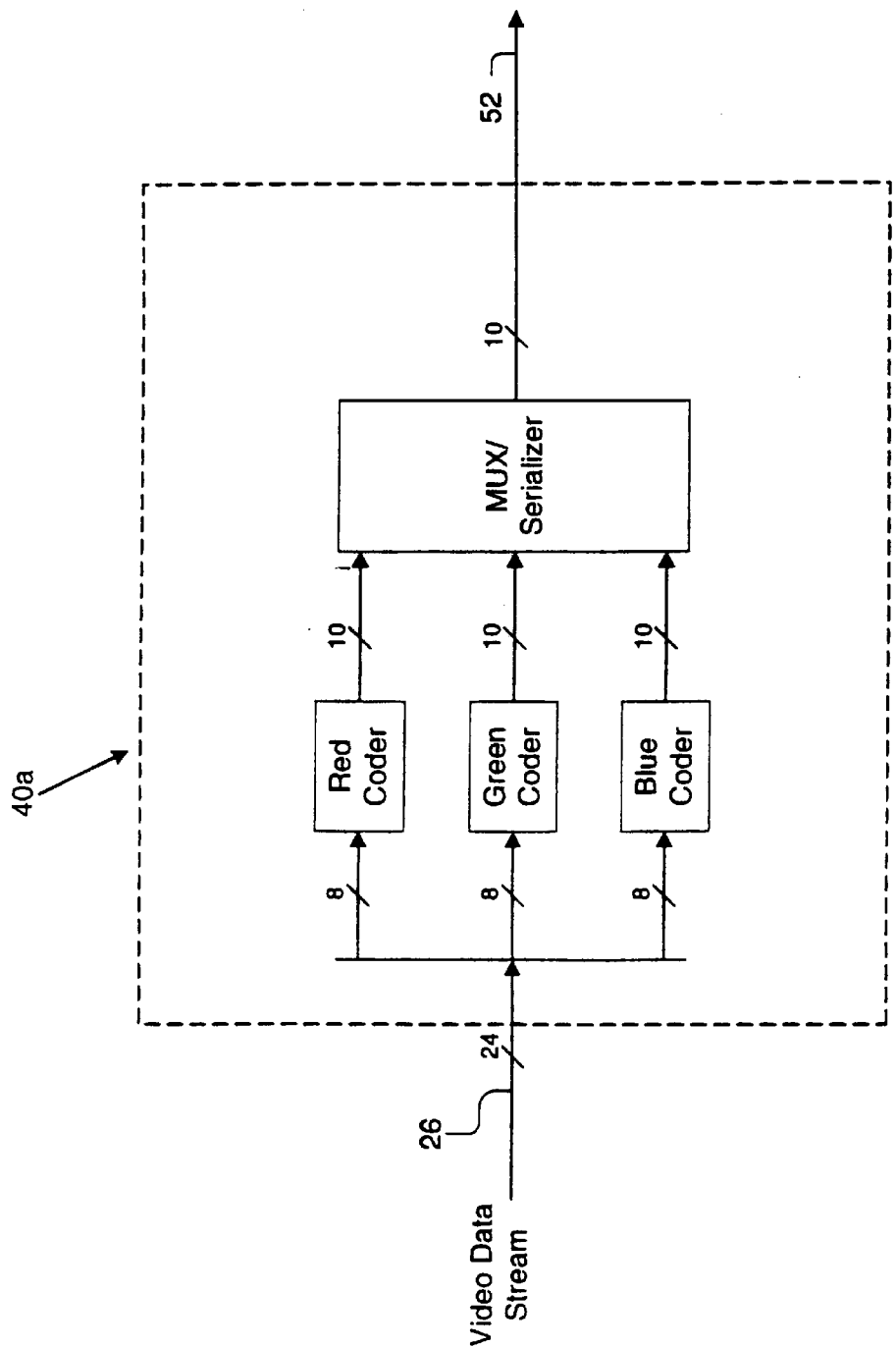
FIG. 5 is block diagram of an embodiment of a video decoder for the second embodiment of the embedding unit constructed according to the present invention.

Still more particularly, a video data coder 40a is provided for encoding the video data signals to a 10-bit parallel output. Those skilled in the art will realize the video data coder 40a may be a plurality of 8-to-10 bit coders depending on the number of bits used to represent the video data. For example, the video data coder 40a may be three 8-to-10 bit coders if 24 bits of RGB data are used with 8 bits for a red channel, 8 bits for a green channel, 8 bits for a blue channel, or two 8-to-10 bit coders for 16 bits of YUV data. An exemplary video coder 40a constructed according to the present invention is shown in FIG. 5. Coders 40u, and 40v are also provided for the video control data, and the isochronous data stream. Similarly, for stream 1 to n each stream has a dedicated coder 40b to 40n, respectively, to encode each particular data stream. The coders 40b to 40n, 40u, 40v are preferably identical, and each maps the eight bit values applied on the inputs of the coders 40b to 40n to a corresponding 10-bit word according to a predefined coding scheme. An exemplary encoding scheme that can be used for coders 40b to 40n is detailed on pages 18–25 and FIG. 7 of U.S. patent application Ser. Nos. 60/004,907 and 08/723,694 entitled "High-Speed Digital Video Signal Transmission System," filed on Oct. 6, 1995 and Sep. 30, 1996, respectively, now U.S. Pat. No. 5,974,464, issued Oct. 26, 1999, which is incorporated herein by reference.

The output of video data coder 40a, video control coder 40u, isochronous coder 40v, are coupled by lines 52a, 52u, 52v, respectively to corresponding inputs of the multiplexor 48. Each of the coders 40a, 40u, 40v, also provides an output coupled via line 64 to the scheduler 46 to provide a waiting signal specifying whether there is data available at the output of the corresponding coder 40a, 40u, 40v, that can be sent on the serial link 28.

The output of coder 1 40b is coupled by line 52b to the input of stream 1 buffer 42b. The output of stream 1 buffer 42b is in turn coupled by line 54b to the an input of the multiplexor 48. The remaining coders 40c to 40n are similarly coupled through respective buffers 42c to 42n to respective inputs the multiplexor 48. Each stream buffer 42b, 42c, 42n is preferably a FIFO buffer capable of storing n encoded words, where n is the number of data streams multiplexed. The stream buffers 42b, 42c, 42n are preferably coupled to the scheduler 46 by line 62 to receive a control signal specifying when the stream buffers 42b, 42c, 42n should be clocked. Each of the stream buffers 42b, 42c, 42n also provides an output coupled via line 64 to the scheduler 46 to provide a waiting signal specifying whether there is data available at the output of the corresponding stream buffer 42b, 42c, 42n that can be sent on the serial link 28.

The embodiment shown in FIG. 3 includes a plurality of control code generators 44a, 44b, 44c . . . 44n, 44x, 44y, 44z. The first control code generator 44x is coupled to an input of the multiplexor 48 via line 60a to provide the IDLE word. Additional control code generators 44y and 44z are provided for supplying the shut down link code and start up link code to the multiplexor via lines 60y, 60z, respectively. The remaining control code generators 44a, 44b, 44c . . . 44n provides respective data stream separation words, one for each stream. Each of the control code generators 44a, 44b, 44c . . . 44n, 44x, 44y, 44z is preferably hard wired to provide the 10-bit words that are used for the IDLE word, start-up link word, shut-down link word, video start word, stream 1 start word, etc. in accordance with the encoding scheme. The isochronous transfer words are generated directly by the video coder 40a. Those skilled in the art will realize that in an alternate embodiment, a data input of the multiplexor 48 could be coupled to a data output of the scheduler 46, and that in such an alternate embodiment the scheduler 46 would generated and provide these codes words as necessary.

Figure 4A:
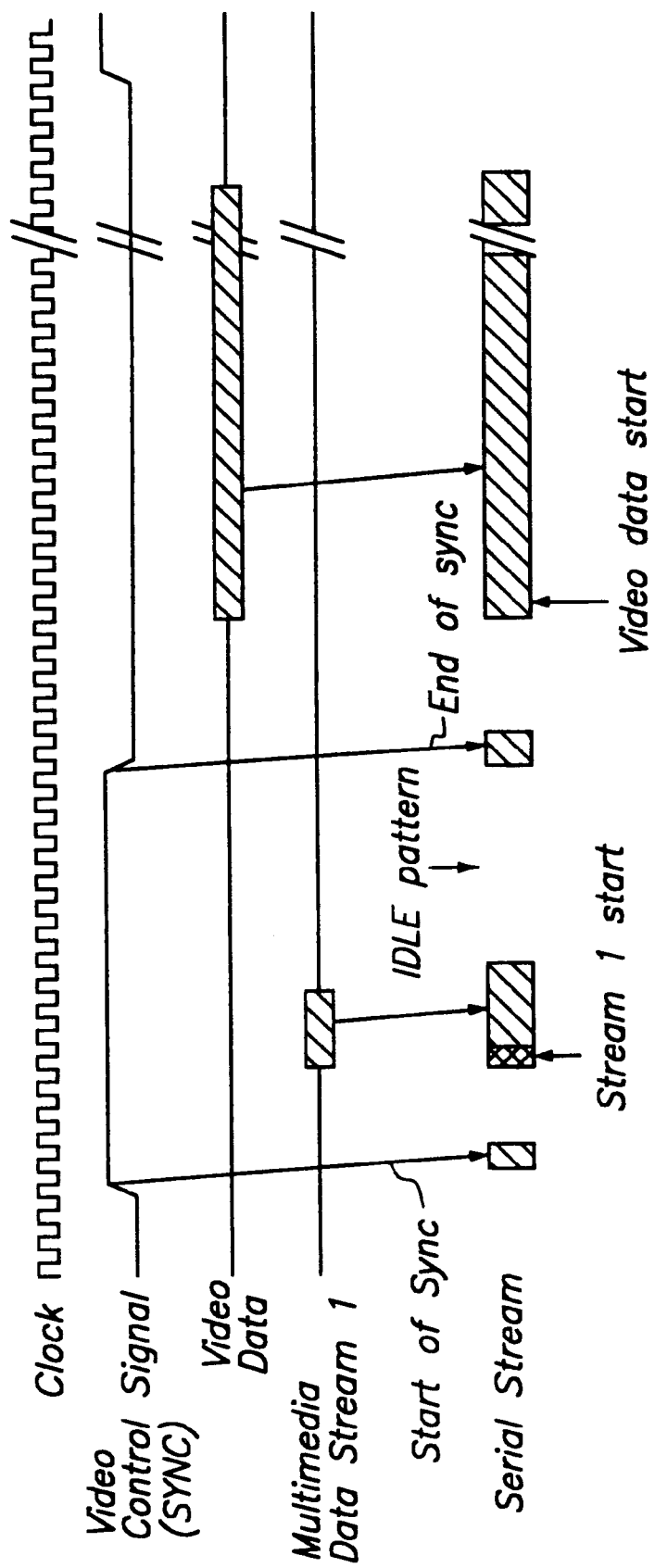
FIGS. 4A and 4B are a timing diagram showing a clock signal, two stream signals input to the embedding unit and a serial output of the embedding unit.
Figure 4B:
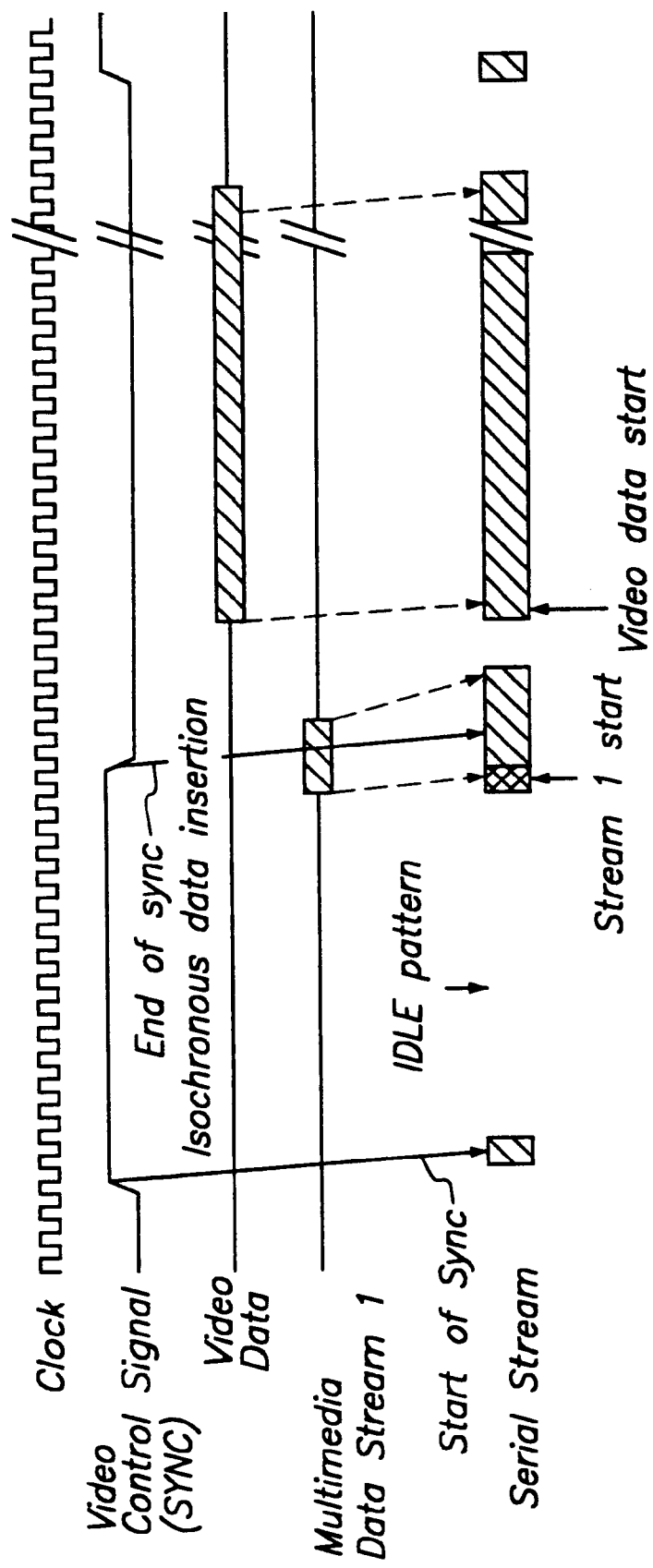

The operation of the present invention can best be understood with reference to FIGS. 4A and 4B. FIG. 4A is a timing diagram showing the clock signal, the video control and data signals that form the primary stream, data signals that for a second stream, and the serial stream produced by the embedding unit 22 and output on line 28. One of the main purposes of the present invention is to make the embedding mechanism look transparent to the video signals and isochronous data streams. The timing of video data signals and control signals at the receiving side do not change due to the embedded signals. The timing diagrams of FIGS. 4A and 4B correspond to the embodiment of the embedding unit shown in FIG. 3, where the video stream has the highest priority, and thus, is sent without being disturbed by other streams. The present invention advantageously encodes the horizontal and vertical sync signal into a pair of beginning and ending isochronous transfer words thereby making much of the vertical and horizontal sync periods available multiplexing with other stream data. As shown in FIG. 4A, video control signals are sent by only sending only isochronous transfer words at the rising and falling edges of the sync signal so the period when the video control signal doesn't change its value can be used to send other data. Rising and falling edges of each video control signals have different special characters. Data stream 1 is inserted during the horizontal blanking period and a start control word identifying the data stream 1 is used at the head of the data stream 1. Each multimedia data stream has its own special start control word for identification. For example, stream 1 has a different data start word than that used for video start word. If every stream buffer is emptied and no video signal enters, the scheduler sends an IDLE word for bit synchronization and word synchronization. FIG. 4B shows a timing diagram of an isochronous data transmission using this invention. If we need to send isochronous or time critical data during the transmission of other data, we can insert an isochronous data transfer word in the middle of the data transmission. In particular, as shown in FIG. 4B, the transmission of the data for stream 1 in interrupted and a isochronous data transfer word is sent, after which the data for stream 1 continues to be sent until there is no more stream 1 data to be sent. Thus, the present invention enables time critical data such as video control signals to be sent such that correct timing will be preserved when the signal is received. The removing unit 24 is able to receive normal data stream without a break in the presence of a special isochronous data transfer words and also separate isochronous timing information at a correct time.

Figure 6:
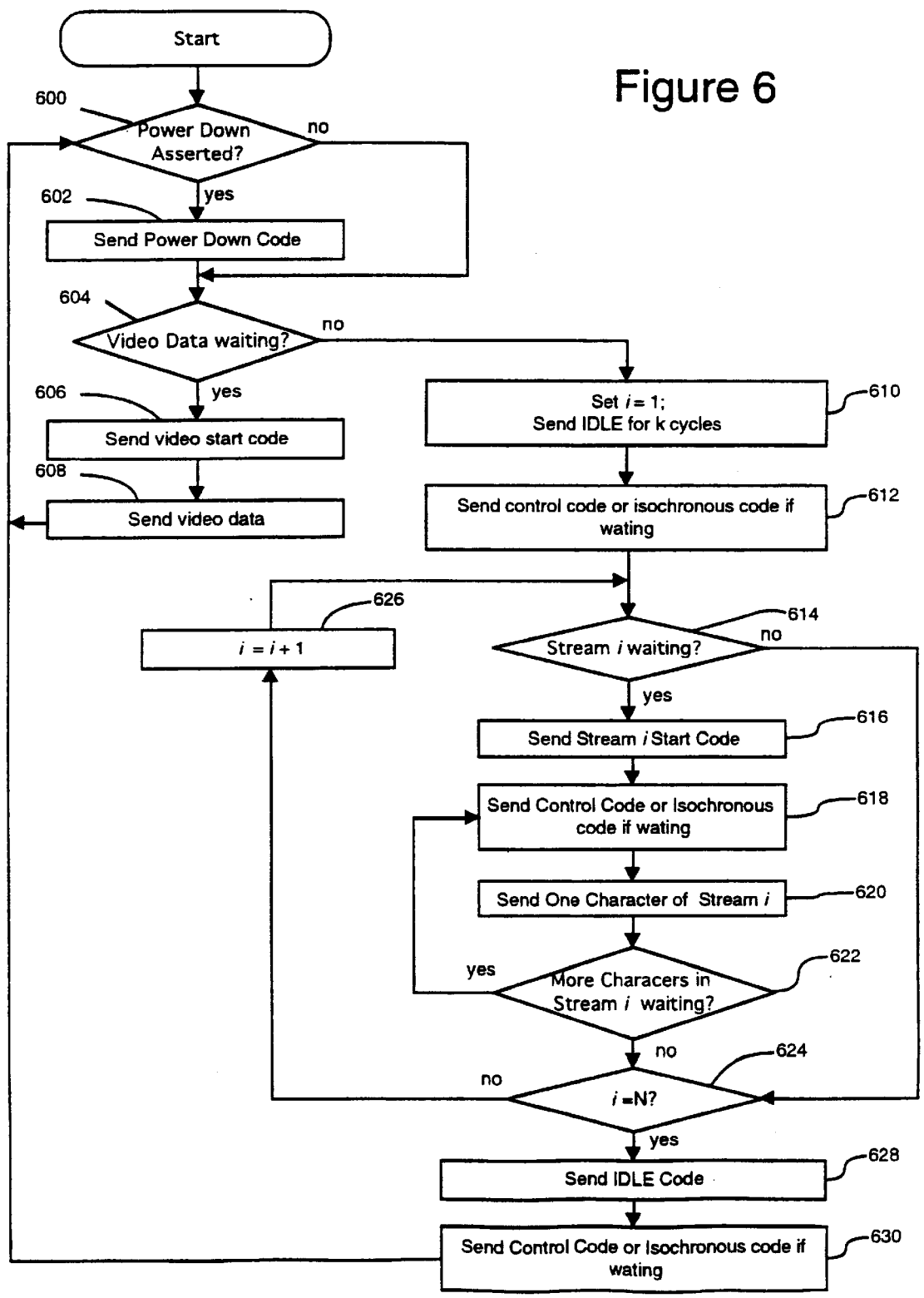
FIG. 6 is block diagram of a preferred embodiment of a scheduler for the embedding unit of the present invention.

Referring now to FIG. 6, a preferred embodiment for the scheduler 46 will be described. The scheduler 46 is responsible for controlling the order in which encoded words are sent to the parallel-to-serial converter 50. The scheduler 46 preferably has a plurality of control inputs coupled to receive a waiting signal from each of the coders 40a, 40u, 40v, and the stream buffers 54b, 54c, 54n, and coupled to receive signals indicating whether the link is operational or not. The scheduler 46 also has a plurality of outputs for controlling the multiplexor 48 or each of the stream buffers 54b, 54c, 54n. The scheduler 46 may be implemented as combinational logic, a state machine, or a programmed processor such as in an application specific integrated circuit, but is best understood from one embodiment of its operation as shown by the flowchart of FIG. 6. As shown in FIG. 6, the scheduler 46 first tests whether the power down signal is asserted in step 600. If the power down signal is asserted, the serial link 28 is to be shut down and the scheduler 46 send control signal to the multiplexor 48 to output the power down code. Then the scheduler 46 proceeds to step 604. If the power down signal is not asserted, the scheduler 46 proceeds directly to step 604. In step 604, the scheduler 46 determines whether there is video data waiting to be send on the link 28. This can be done by monitoring the waiting output of coder 40a. If there is video data waiting to be sent, the scheduler 46 continues in step 606 by outputting a control signal to the multiplexor 48 to send the start video data code, and then in step 608 by outputting a control signal to the multiplexor 48 to send the video data. After step 608, the scheduler 46 returns to step 600. If there is no video data waiting to be sent, the scheduler 46 proceeds to step 610 where i is set to 1 and the scheduler 46 outputs a control signal to send the IDLE code for a predetermined number, k, of clock cycles. Then in step 612, the scheduler 46 determines whether there are any isochronous signals to be sent such from the video control coder 40u or the isochronous word coder 40v and outputs a control signal to send the isochronous control words.

Next in step 614, the scheduler 46 determines whether the ith stream has any data ready to be sent over the link 28. If not, the scheduler 46 continues in step 624. If the ith stream has data ready to be sent over the link 28, then the scheduler 46 outputs control signals to the multiplexor 48 to send the start ith start word in step 616. Then in step 618, the scheduler 46 determines whether there are any isochronous signals to be sent such from the video control coder 40u or the isochronous word coder 40v and outputs a control signal to send the isochronous control words. This ensures that if there are any isochronous signals to be sent over the link 28 they will be injected into the data stream immediately to preserve their timing. Then in step 620, the scheduler 46 outputs the control signals to the multiplexor 48 to send a data word of the ith data stream. Next in step 622, the scheduler 46 tests whether there are more characters ith data stream that are stored in the corresponding buffer that need to sent. If so, the method loops back to step 618. If not the scheduler 46 continues in step 624, by testing whether this is the last data stream by comparing the value of i to the value of n, the number of data streams. If i is not equal to n, the scheduler 46 increments the value of i in step 626 and thereafter continues in step 614. If i is equal to n, the scheduler 46 outputs control signals to output the IDLE code in step 628, and then determines whether there are any isochronous signal to be send such from the video control coder 40u or the isochronous word coder 40v and outputs a control signal to send the isochronous control words in step 630. After step 630, the scheduler 46 returns to step 600.

Figure 7:
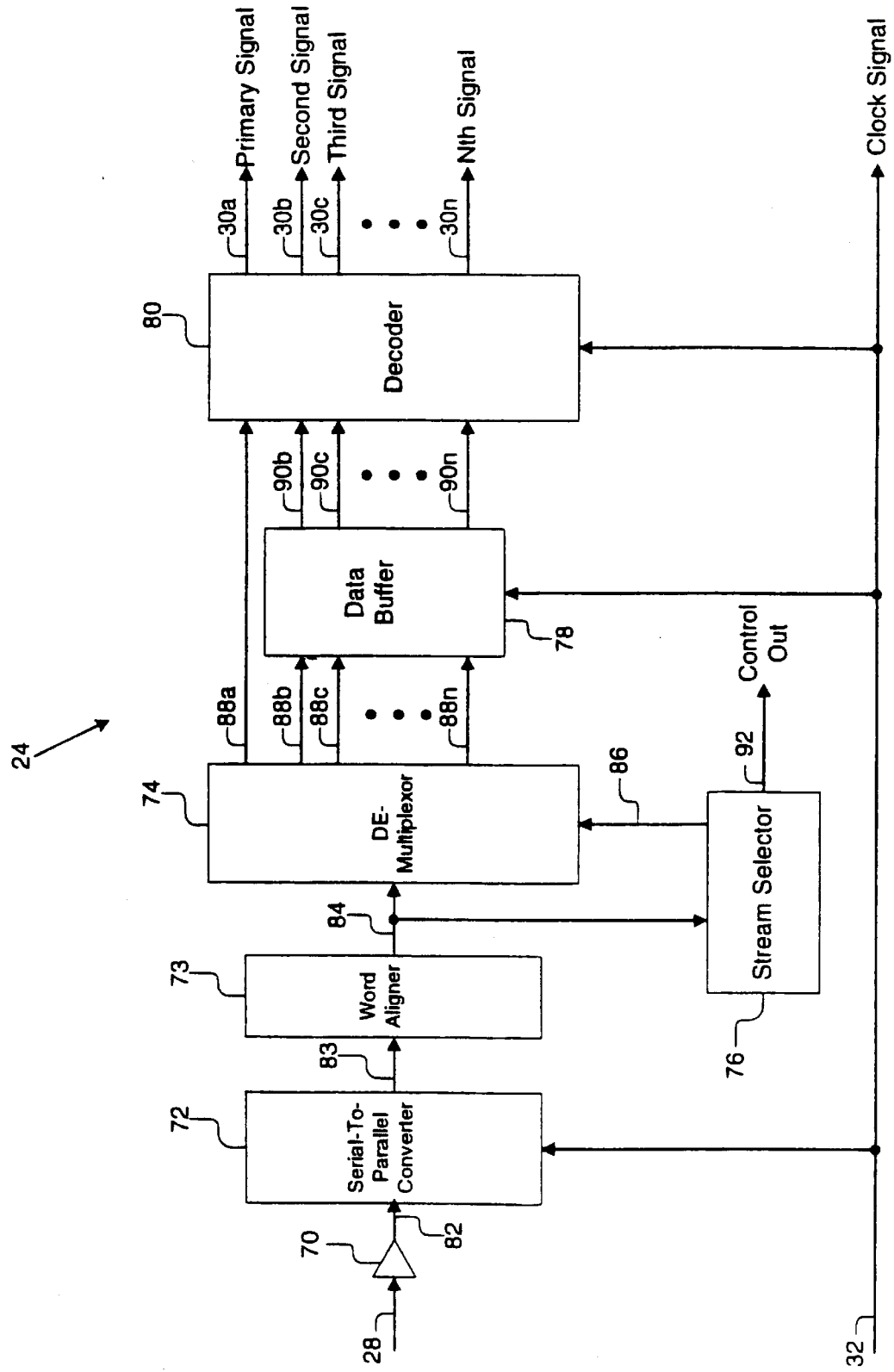
FIG. 7 is a block diagram of a first embodiment of the removing unit of the system constructed according to the present invention.

Turning now to FIG. 7, a first embodiment of the removing unit 24 is shown. The removing unit 24 preferably comprises a driver 70, a serial-to-parallel converter 72, a word aligner 73, a stream selector 76, a de-multiplexor 74, a data buffer 78 and a decoder 80. The removing unit 24 separates the serial data from the link 28 into a plurality of data streams. At the removing unit 24 side, the serial bit stream is converted to k-bit parallel data words and word aligned. The k-bit parallel words are then routed to the appropriate channel for decoding and then use in a conventional manner. The system 20 of the present invention appears transparent such that the signals provided by the decoder 80 on lines 30a to 30n are identical in data content and respective timing as the corresponding signals input on lines 26a to 26n. FIG. 7 also illustrates the use of the clock signal received on line 32. The clock signal is preferably provided to each of the components 72, 74, 76, 78 80 in a conventional manner for use in processing the serial bit stream received on line 28.

The input of the removing unit 24 is provided by the input to a buffer or line driver 70. The output of the buffer 70 provides the serial data stream to the serial-to-parallel converter 72 via line 82.

The serial-to-parallel converter 72 has a data input and a plurality of data outputs. The serial-to-parallel converter 72 converts the serial stream into a k-bit parallel data word. For example, the serial-to-parallel converter 72 converts the serial stream into a 10-bit word. The serial-to-parallel converter 72 also performs word alignment. For converting the serial stream to 10-bit words, an exemplary embodiment of such a serial-to-parallel converter 72 is shown in FIG. 5 and the corresponding description of U.S. patent application Ser. Nos. 60/004,907 and 08/723,694, entitled "High-Speed Digital Video Signal Transmission System," filed on Oct. 6, 1995 and Sep. 30, 1996, respectively, now U.S. Pat. No. 5,974,464, issued Oct. 26, 1999, which is incorporated herein by reference. The serial-to-parallel converter 72 may alternatively be constructed of a serial-in, parallel out shift register and a buffer register. The data input of the serial-to-parallel converter 72 is coupled line 82 to receive the serial data stream, and provides its parallel outputs on via line 83.

The output of the serial-to-parallel converter 72 is provided as an input to a word aligner 73. The word aligner 73 uses the idle characters in the data stream for bit and word synchronization. The word aligner 73 has a plurality of inputs and a plurality of outputs for receiving the encoded data in parallel and outputting the encoded data word aligned in parallel. The word size in the exemplary embodiment is preferably 10 bits. The plurality of inputs are coupled to line 83 and the plurality of outputs are coupled to line 84. The coupling of the word aligner 73 immediately after the serial-to-parallel converter 72 is particularly advantageous because special character separation can be done simply by counting the number of transitions within the 10-bit boundary. An example of a word aligner will be described in more detail below with reference to FIGS. 10A and 10B.

The parallel, word-aligned bits on line 84 are provided as inputs to the de-multiplexor 74 and the stream selector 76. The de-multiplexor 74 preferably has a plurality of data inputs, a plurality of data outputs, and a control input. The inputs of the de-multiplexor 74 are coupled to receive an encoded word from the serial-to-parallel converter 72. The plurality of outputs are grouped into sets, each set having a number of outputs equal to the number of inputs to the de-multiplexor 74. Thus, each set of outputs defines a channel to which the word received at the inputs of the de-multiplexor 74 can be routed. Each of the sets of outputs of the de-multiplexor 74 is coupled to a respective signal line 88a, 88b, 88c, ... 88n. In the exemplary embodiment, there are 10 inputs, and n set of 10 outputs. The de-multiplexor 74 is controlled, or the channel to which the word on the input of the de-multiplexor 74 will be routed is selected, by a signal received via line 86 from the stream selector 76.

The stream selector 76 is also coupled to line 84 to receive the encoded word from the serial-to-parallel converter 72. The stream selector 76 detects special words and directs the words to the appropriate channels by controlling the de-multiplexor 74. For example, the stream selector 76 compares the word on line 84 to stream separation words, and then couples line 84 with the appropriate stream channel represented by signal lines 88a, 88b, 88c, ... 88n. Since each stream has a unique separation word indicating the start of a data stream, the de-multiplexor 74 can be switched accordingly upon detection of the separation words. The stream selector 76 preferably does this by selecting an output stream channel whenever a start control word of a stream or a isochronous data character of the video stream is provided on line 84. If normal data words or the IDLE word are detected by the stream selector 76, there is no selection changes and the selected stream for outputting the words remains unchanged. One exemplary embodiment for the stream selector 76 will be described in more detail below with reference to FIG. 9. The stream selector 76 also has an output coupled to line 92 to provide control signals when a link shut down or start up word is received such that other components on the removing unit side can be notified of periods when the link 28 is operation for low power operation and other purposes.

The de-multiplexor 74 outputs the various data streams on signal lines 88a, 88b, 88c, . . . 88n. The first stream signal line 88a is coupled to an input of decoder 80. The remaining data streams are coupled to respective inputs of a data buffer 78. The outputs of the data buffer 78 are in turn coupled to respective inputs of the decoder 80. The buffer 70 is preferably used for re-timing the data stream signals where such a function is not performed by the scheduler 46. In other words, the data for a stream is stored in the buffer until a block of data for the stream is present and can then be sent to decoder 80 as a group. In an alternate embodiment, the buffer 70 may be eliminated with the outputs of the de-multiplexor 74 coupled to respective inputs of the decoder 80.

Finally, the encoded parallel streams are applied to the inputs of the decoder 80 via lines 88a, 90b, 90c . . . 90n. Each of the signal lines represents k-bits in parallel of an encoded word. The decoder 80 effectively decodes or translates each signal line into a respective n-bit word. For example, the decoder removes any encoding provided by the embedding unit 24 by converting the 10-bit words into their original 8-bit word form. The signals are each output on a respective signal line 30a, 30b, 30c . . . 30n.

Figure 8:
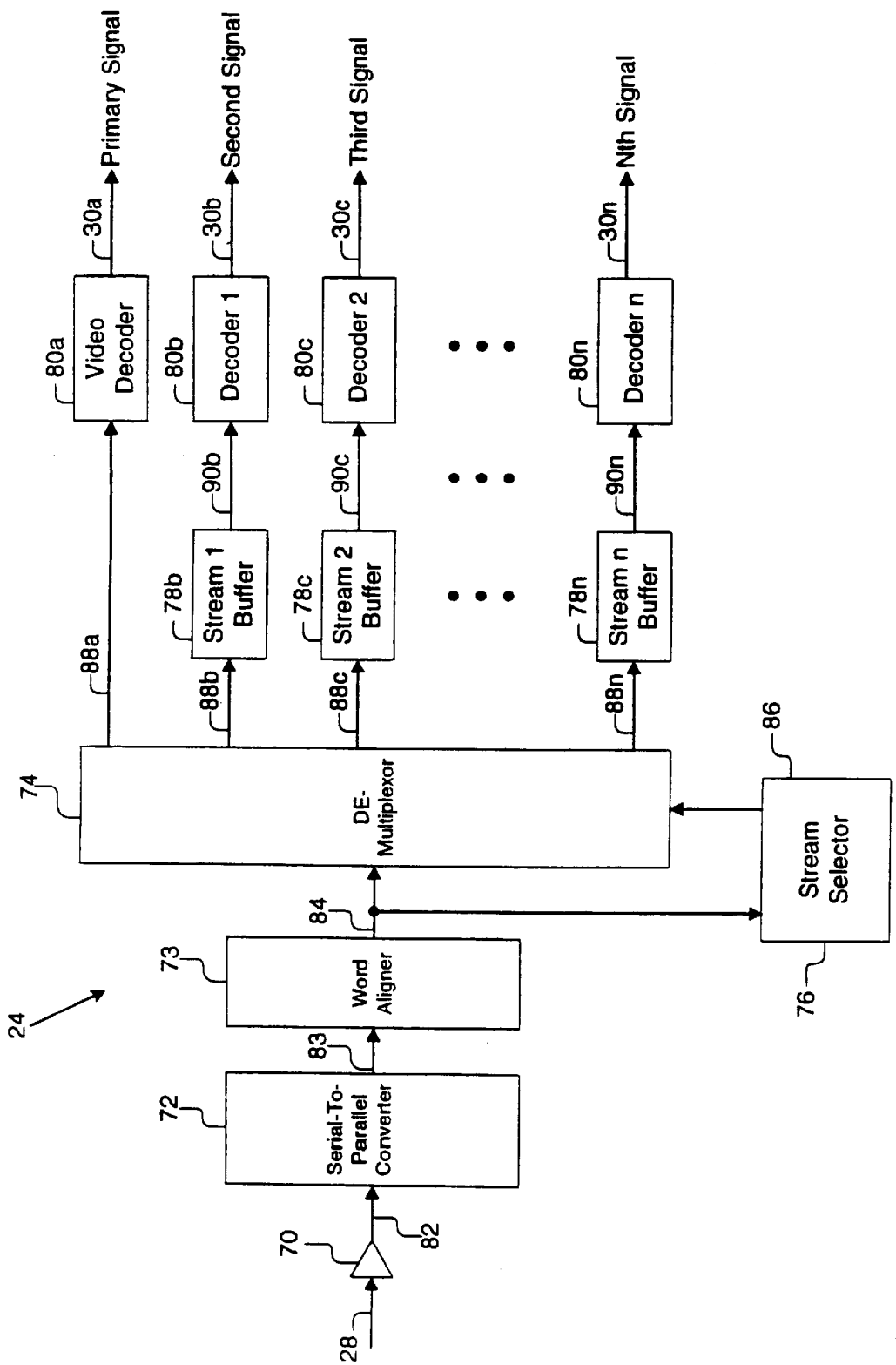
FIG. 8 is a block diagram of a second embodiment of the removing unit of the system constructed according to the present invention.

Referring now to FIG. 8, a second, more specific embodiment of the removing unit 24 is shown in detail. For ease of understanding and convenience, like parts have been labeled with like reference numerals. The specific embodiment shown in FIG. 8, is intended for use where the primary data stream includes video data and control signals, and the other data streams 1 to n are for additional multiplexed data that does not include isochronous information. The embodiment of the present invention shown in FIG. 8 is similar to the embodiment shown in FIG. 7, except that the data buffer 78 and decoder 80 are replaced by a plurality of stream buffers 78b, 78c . . . 78n and a plurality of decoders 80a, 80b, 80c . . . 80n, respectively.

The second through nth outputs of the de-multiplexor 74 are coupled via lines 88b, 88c, 88n to respective stream buffers 78b, 78c, 78n. The output of stream 1 buffer 78b is in turn coupled by line 90b to the input of the first decoder 80b. The remaining streams are similarly coupled through respective buffers 78c to 78n to inputs of respective decoders 80c to 80n. Each stream buffer 78b, 78c, 78n is preferably a FIFO buffer capable of storing n encoded 10-bit words, where n is the number of streams that are being de-multiplexed.

Still more particularly, the video decoder 80a is provided for decoding the video data and control signals to a 8-bit parallel data output signal and parallel control signals. Similarly, for stream 1 to n each stream has a dedicated decoder 80b to 80n, respectively, to decode each particular data stream. The decoders 80a to 80n are preferably identical, and each maps the 10-bit values applied on the inputs of the decoders 80a to 80n to a corresponding 8-bit word by applying the inverse of the predefined coding scheme. An exemplary decoding scheme that can be used for the decoders 80a to 80n is detailed on pages 25–28 and FIGS. 8 and 9 of U.S. patent application Ser. No. 60/004,907 entitled "High-Speed Digital Video Signal Transmission System," filed on Oct. 6, 1995, which is incorporated herein by reference.

Figure 9:
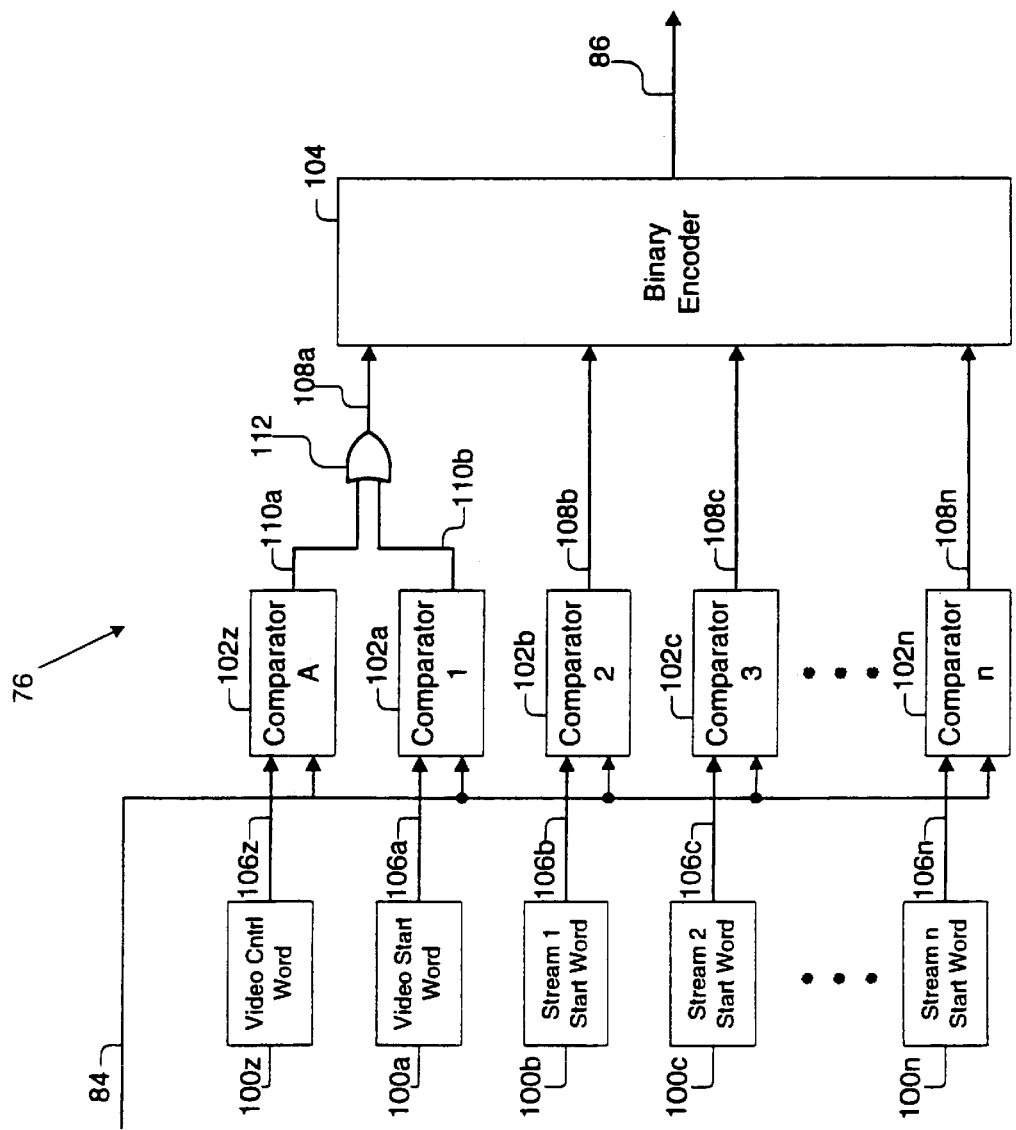
FIG. 9 is block diagram of an embodiment of a stream selector for use in the second embodiment of the removing unit.

Referring now to FIG. 9, an embodiment for the stream selector 76 is shown in detail. This embodiment of the stream selector 76 is designed for a system in which the primary stream is video control and data, and the remaining streams are data without any isochronous data transfer words. The stream selector 76 of FIG. 9 preferably includes a plurality of comparators 102a . . . 102n, 102z, an OR-gate 112 and a binary encoder 104. The stream selector 76 may also include a plurality of registers or hard-wired couplings 101a . . . 101n, 101z, such that each outputs a different isochronous data transfer word or a data stream separation word. Comparator A 102z has a first input, a second input and an output and compares the signals applied at its input for a match. The first input of comparator A 102z is coupled via line 106z to the output of the register 100z storing the video control word(s). The second input of Comparator A 102z is coupled to receive the encoded word via line 84. The remaining comparators 1 to n 102a, . . . 102n are similarly coupled to receive a respective start control word in the first input and the word from the serial link 28 on line 84. The output signaling a match by comparator A 102z is provided on line 110a to a first input of the OR-gate 112. The output signaling a match by comparator 1 102a is provided on line 110b to a second input of the OR-gate 112. The output of the OR-gate 112 is in turn coupled to a first input of the binary encoder 104. Thus, if either a video control word or a video start word is received on line 84, then the binary encoder 104 will provide a signal to the de-multiplexor 74 via line 86 to output the stream on line 88a. The outputs of the other comparators 102b, . . . 102n are similarly coupled to respective inputs of the binary encoder 104 for translation into a signal applied on line 86 that will switch the de-multiplexor 74 output to the appropriate stream signal line 88b, . . . , 88n.

Figure 10A:
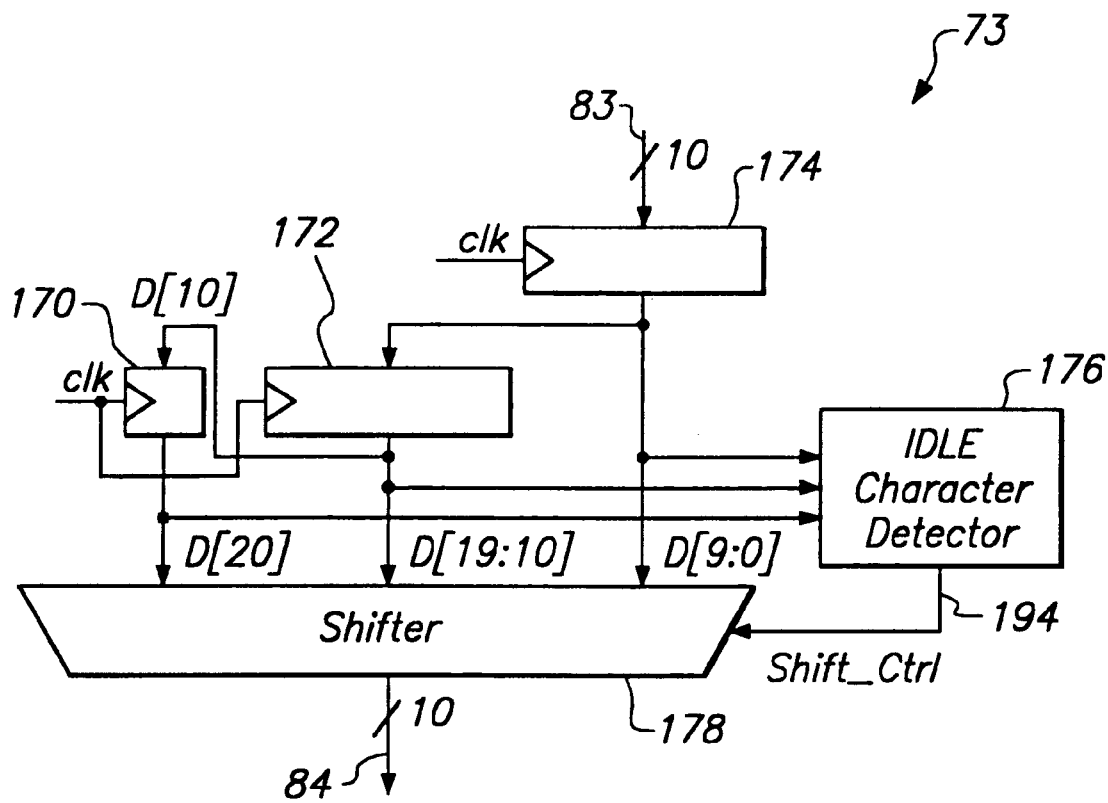
FIG. 10A is schematic diagram of an embodiment of a word aligner of the removing unit of the present invention.
Figure 10B:
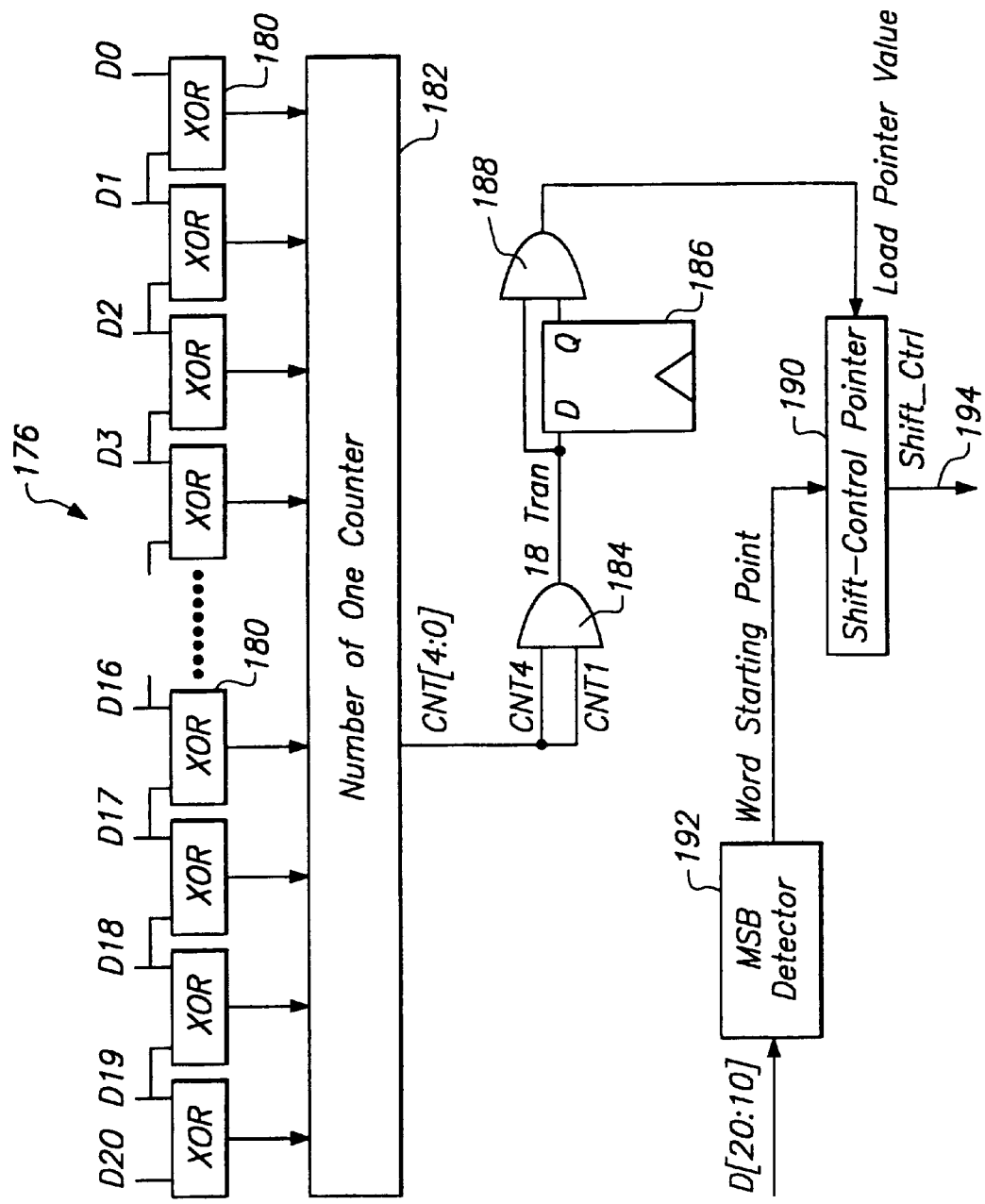
FIG. 10B is schematic diagram of an embodiment of an idle character detector of the word aligner of the present invention.

Referring now to FIGS. 10A and 10B, a preferred embodiment for the word aligner 73 will be described. The word aligner 73 will now be described with reference to a word aligner 73 for the exemplary embodiment in which the words are 10 bits in size. Those skilled in the are will recognize how to construct word aligners where the words have other sizes. The encoding scheme used by the present invention advantageously separates special characters from normal characters based on the number of transitions within a word boundary. Idle characters have eight transitions within a 10 bit boundary while isochronous data transfer words and data stream separation words have six transitions within a 10 bit boundary; the isochronous data transfer words beginning with a 0, and the data stream separation words beginning with a 1. The IDLE words are noted below in Appendix A. An idle pattern is a continuous sequence of one of the idle words and its inverse. An exemplary idle pattern is: 011010101010010101010110101010100101 010101101010101001010101 The word aligner 73 detects the idle pattern by looking at a 21 bit data window and counting the number of transitions within the 21 bit data window. If there are 18 transitions for two successive periods within the 21 bit data window, the IDLE pattern is detected and word alignment is performed. It is guaranteed that there cannot be 18 transitions for two successive periods within 21 bit data window for any combination of other special characters or normal data.

As shown in FIG. 10A, the word aligner 73 preferably comprises a first register 170, a second register 172, a third register 174, an idle character detector 176 and a shifter 178. The first register 170 preferably has 10 inputs and 10 outputs. The inputs of the first register 174 are coupled to line 83 to receive the converted parallel word. The outputs of the first register 174 are coupled to the inputs D[9:0] of the shifter 178, inputs of the IDLE character detector 176 and the input of the second register 172. The second register 172, like the first register 174, preferably has 10 inputs and 10 outputs. The outputs of the second register 172 are coupled to the inputs D[19:10] of the shifter 178, and inputs of the IDLE character detector 176. The least significant bit output, D[10], of the second register 172, is also coupled to an input of the third register 170. The third register 170 preferably has an input and output, with the output coupled to the MSB input D[20] of the shifter 178, and an input of the IDLE character detector 176. The first, second and third registers 174, 172, 170 each have a clock input coupled to receive the system clock. Thus, over three successive clock cycles the 21 bit window output by the first, second and third registers 174, 172, 170 is provided to both the idle character detector 176 and the shifter 178. The shifter 178 receives the 21 bits from the registers 174, 172, 170 and outputs 10 adjacent bits in response to the control signal applied to its inputs. The output of the shifter 178 is coupled to provide the 10 word-aligned bits on line 84.

The idle character detector 176 has inputs and outputs, and the outputs are coupled to the control inputs of the shifter 178. As shown in more detail in FIG. 10B, the idle character detector 176 preferably comprises a plurality of exclusive-OR gates 180, a counter 182, a first AND gate 184, a D-flip-flop 186, a second AND gate 188, a shift-control pointer 190 and a MSB detector 190. There are preferably twenty exclusive-OR gates 180. Each of the exclusive-OR gates 180 has its two inputs coupled to receive adjacent bits. For example, a first exclusive-OR gate 180 is coupled to receive bits D0 and D1, and the next exclusive-OR gate 180 is coupled to receive bits D1 and D2, and so on. Each of the outputs of the plurality of exclusive-OR gates 180 are coupled to a respective input of the counter 182. The counter 182 preferably counts the number of ones receive on its inputs, thereby, counting the number of transitions in the 21 bit window. The counter 182 also encodes the number of ones into a 5 bit binary number. Thus, the counter 182 has five outputs. The second and fifth outputs of the counter 182 (CNT 4, representing the MSB=16 and CNT 1 representing the next to LSB=2) are coupled to respective inputs of AND gate 184. Thus, AND gate 184 signals a condition when there are eighteen transitions on the 21 bit window. The output of AND-gate 184 is input to AND-gate 188 directly and through the flip-flop 186. The output of AND-gate 188 is used to control the loading the shift-control pointer register 190, and the shift-control pointer register 190 will be loaded only if there are eighteen transitions on the 21 bit window in two successive cycles. The input of the shift-control pointer register 190 is coupled to the output of the MSB detector 192. The MSB detector 192 is coupled to receive bits D[20:10] from the second and third registers 172, 170, and outputs a value indicating the position of the MSB of the idle word. For example, for the above exemplary idle pattern, the MSB detector 192 will find the position of either the sequence 011 or 100 as the MSB position, and will output a value of the MSB for the word correctly aligned, which in turn will be loaded into the shift-control pointer register 190 to control the shifter 178 via line 194.

Figure 11:
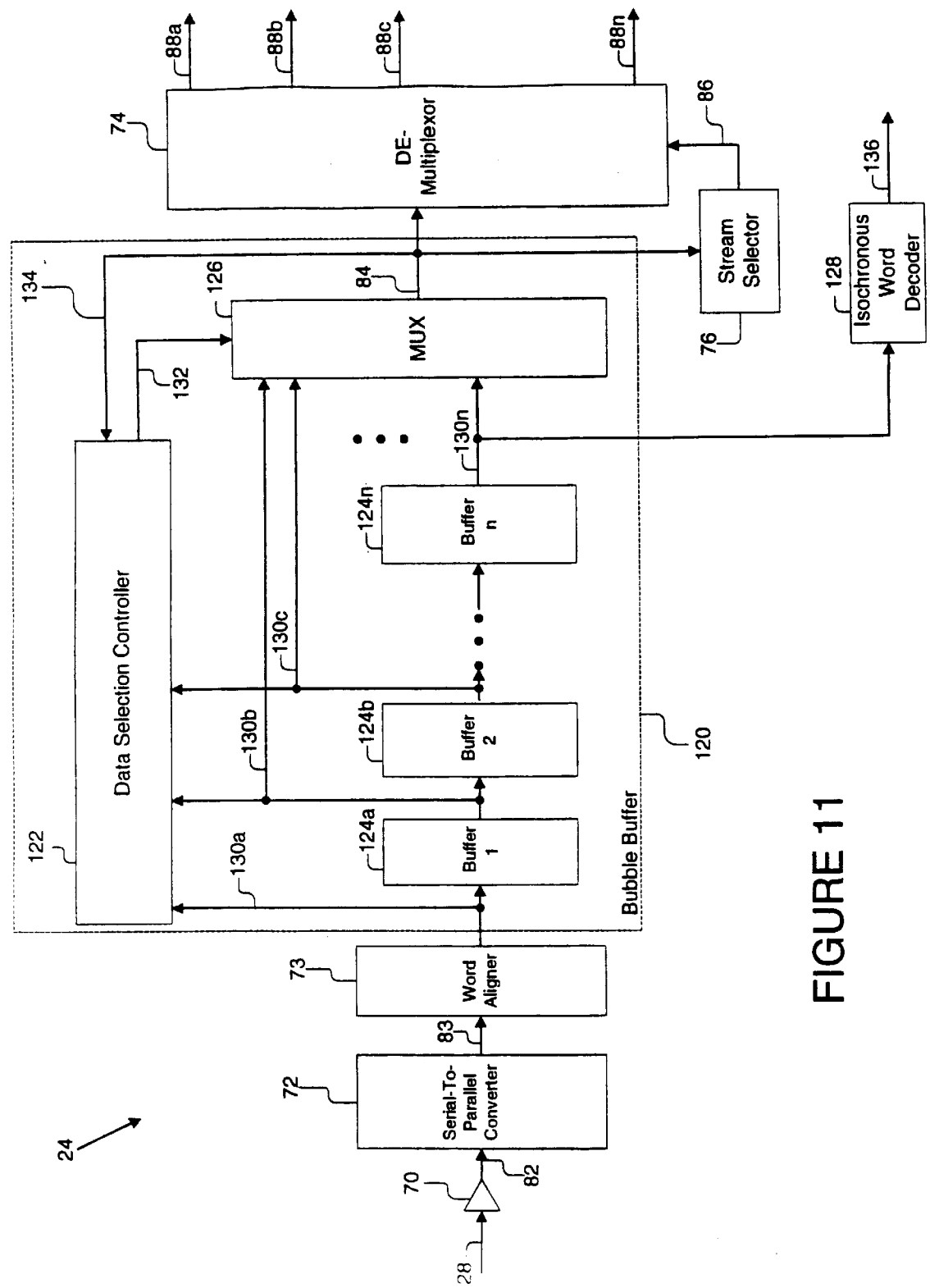
FIG. 11 is a block diagram of a third embodiment of the removing unit of the system of the present invention including a bubble buffer.

Turning now to FIG. 11, a third embodiment of the removing unit 24 is shown. For ease of understanding and convenience, FIG. 11 only shows the portions of the third embodiment that differ from the other embodiments. In particular, the decoders have not been included in FIG. 11, to focus on the differences between this embodiment and previous embodiments. Again, For like parts, which have similar or identical functionality, have been labeled with like reference numerals used in the other embodiments. The third embodiment of the removing unit 24 is particularly advantageous because it includes a "bubble buffer" structure 120 to separate normal data without a break from special isochronous data transfer words. The third embodiment of the removing unit 24 further comprises a data selection controller 122, a plurality of buffers 124a, 124b, . . . 124n, a multiplexor 126 and an isochronous word decoder 128 that form the bubble buffer structure 120, in addition to the driver 70, the serial-to-parallel converter 72, the word aligner 73, the de-multiplexor 74 and the decoder 80 that have already been described above with respect to other embodiments. The data selection controller 122, a plurality of buffers 124a, 124b, . . . 124n, a multiplexor 126 and an isochronous word decoder 128 are preferably coupled between the serial-to-parallel converter 72 and the de-multiplexor 74.

The "bubble buffer" structure 120 of the third embodiment of the removing unit 24 provides a plurality of buffers 124a to 124n. The number of buffers 124a to 124n is preferably at least as many the number of different data streams that are capable of being multiplexed into the serial stream by the embedding unit 22. The first buffer 124a has an input and an output. The input of the first buffer 124a is coupled to line 130a to receive the output of the word aligner 73. The output of the first buffer 124a is coupled by line 130b to the input of the second buffer 124b. The remaining buffers 124b to 124n are similarly coupled in a cascaded manner to form an n-stage buffer. The final buffer 124n has its output coupled to an input of the multiplexor 126, and to the input of the isochronous word decoder via line 130n. The output of each buffer 124a, 124, 124n is preferably coupled to a respective input of the multiplexor 126 via a respective output line 130b, 130c, 130n. Thus, the multiplexor 126 is able to provide any of the n words stored in the bubble buffer 120 to the input of de-multiplexor 74 using line 84, and then on to the appropriate channel through the de-multiplexor 74. The outputs of the serial-to-parallel converter 72 and the first n−1 buffers are also coupled to respective inputs of the data selection controller 122 by lines 130a, 130b and 130c, respectively.

As has been noted above, the final buffer 124n has its output coupled to the input of the isochronous word decoder 128 via line 130n. This allows any isochronous words to be decoded while preserving timing within the signal. The isochronous word decoder 128 preferably decodes the isochronous words and outputs the corresponding timing control signals on line 136. For example, the isochronous word decoder 128 may be a decoder like the others described above as well as additional generation logic as will be understood to those skilled in the art to provide the control signals in the format and on lines as desired. For example, if the only isochronous signals were the horizontal sync signal, the vertical sync signal and the DE control signal used with video, the additional generation logic would provide a separate signal line for each control signal and asserted and de-assert the signals in response to the receipt of isochronous data transfer words indicating when to assert such control signals.

The data selection controller 122 controls the operation of the bubble buffer 120 and receives data signals from the serial-to-parallel converter 72 and the buffers 124a, 124b on lines 130a, 130b, 130c. The data selection controller 122 also has an input coupled to the output of the multiplexor 126 via line 134. The data selection controller 122 specifies which the buffer outputs will be input to the de-multiplexor 74. The data selection controller 122 has an output coupled by line 132 to the control the multiplexor 126. The data selection controller 122 basically maintains a pointer to the buffer 124a, 124b, 124n whose output is being output by the multiplexor 126. The data selection controller 122 monitors the (n−1)th buffer 124b for an isochronous data transfer word. If no isochronous data transfer word is detected, the data is transferred through buffer n and on to the de-multiplexor 74. If an isochronous data transfer word is detected, then after the next clock: 1) the isochronous data transfer word will be stored in the nth buffer and provided to the isochronous word detector 128, and 2) the multiplexor 126 will be switched to provide the output of the next buffer to the left that does not store an isochronous data transfer word at the output of the multiplexor 126.

Figure 12:
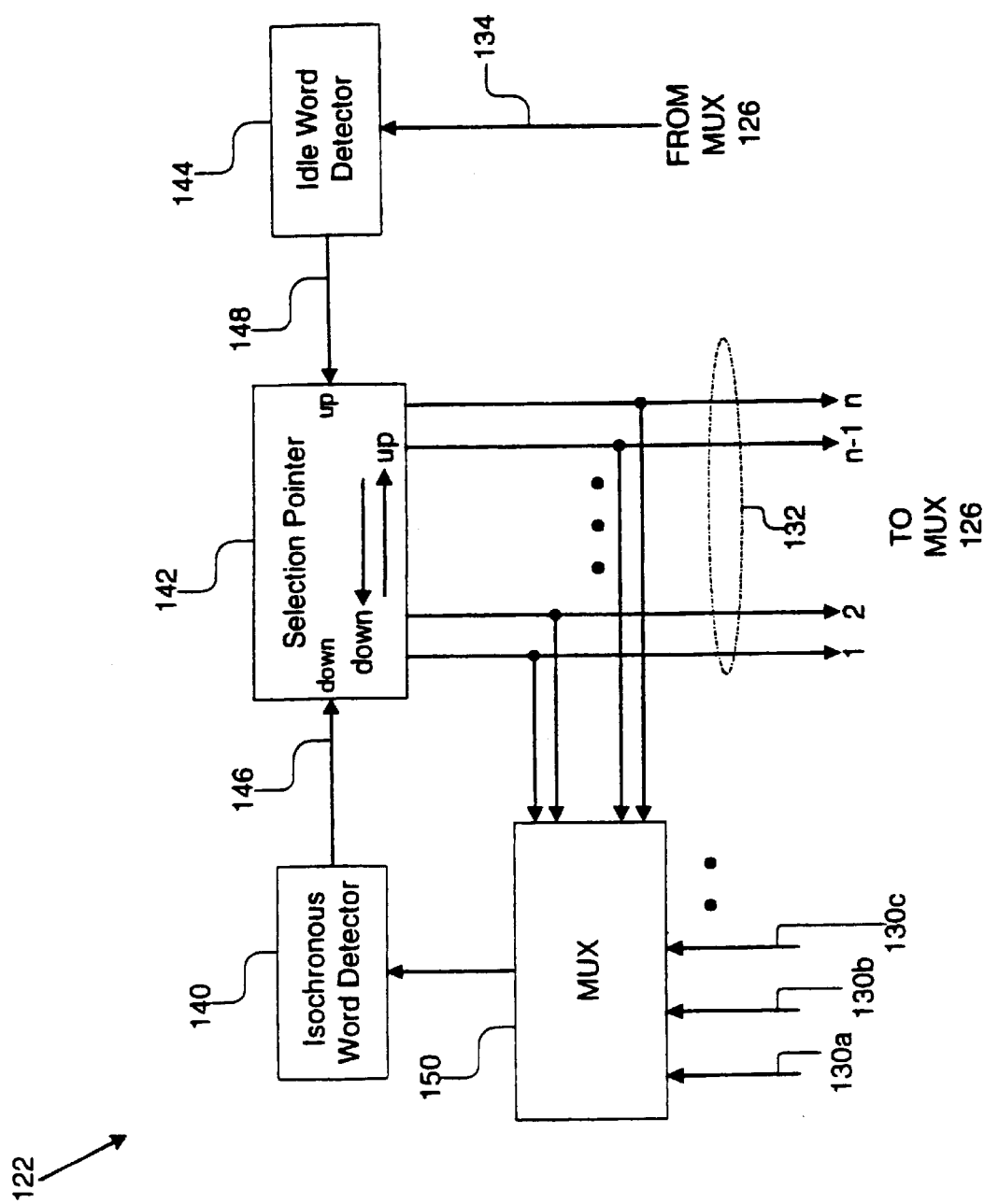
FIG. 12 is a block diagram of a preferred embodiment of a data selection controller for the bubble buffer of the third embodiment of the removing unit.

Referring now to FIG. 12, the data selection controller 122 is shown in more detail. The data selection controller 122 preferably comprises an isochronous word detector 140, a selection pointer 142, an idle word detector 144 and a multiplexor 150. The selection pointer 142 has an up control input, a down control input, and an output. The selection pointer 142 determines which signal will be output by multiplexor 126 because its output is coupled via line 132 to the control inputs of multiplexor 126. The output of the selection pointer 142 is also coupled to the control input of multiplexor 150 to control the signal applied to the isochronous word detector 140. The selection pointer 142 can be any kind of pointer which provides control signals for an N-to-1 multiplexor and a up/down control for the pointer. In FIG. 12, the pointer is a N-bit unary pointer. Only one bit out of N bits can have logic value 1. If an up signal is applied, the position of logic 1 bit moves to right. If a down signal is applied, it moves to left.

Figure 13:
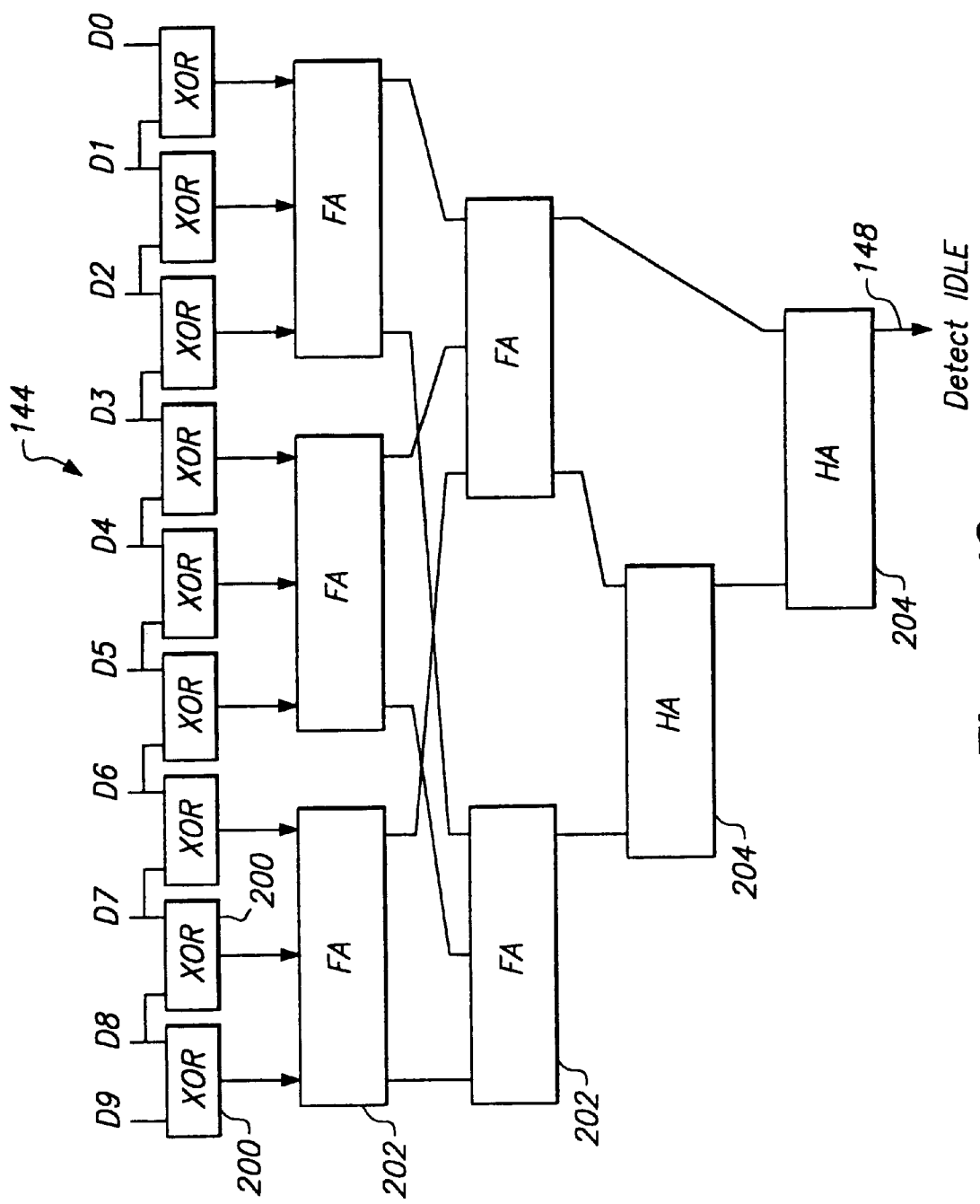
FIG. 13 is a block diagram of an exemplary embodiment of the idle word detector of the data selection controller according to one embodiment of the present invention.

The idle word detector 144 has an input and an output, and compares the signal applied at its input to the value used in the encoding scheme for an IDLE word. The input of the idle word detector 144 is preferably coupled via line 134 to the output of the multiplexor 126. The output of the idle word detector 144 is coupled via line 148 to the up control input of the selection pointer 142. Thus, whenever an idle character is detected at the output by the multiplexor 126, the selection pointer 142 will be moved left or upward toward N. The selection pointer 142 will continue to point to N for additional assertions of the up control input if the pointer is already pointing to N. An exemplary idle word detector 144 is shown with specificity in FIG. 13. The exemplary embodiment of the idle word detector 144 preferably comprises a plurality of exclusive-OR gates 200, a plurality of adders 202, and a plurality of half adders 204. The exclusive-OR gates 200, a plurality of adders 202, and a plurality of half adders 204 are coupled as shown in FIG. 13, and are used to count the number of transitions in the word input to the idle word detector 144. Since the encoding scheme requires that an idle character have eight transitions, the output of the final half adder 204 is asserted and output via line 148 if eight transitions are detected by the plurality of exclusive-OR gates 200.

Figure 14:
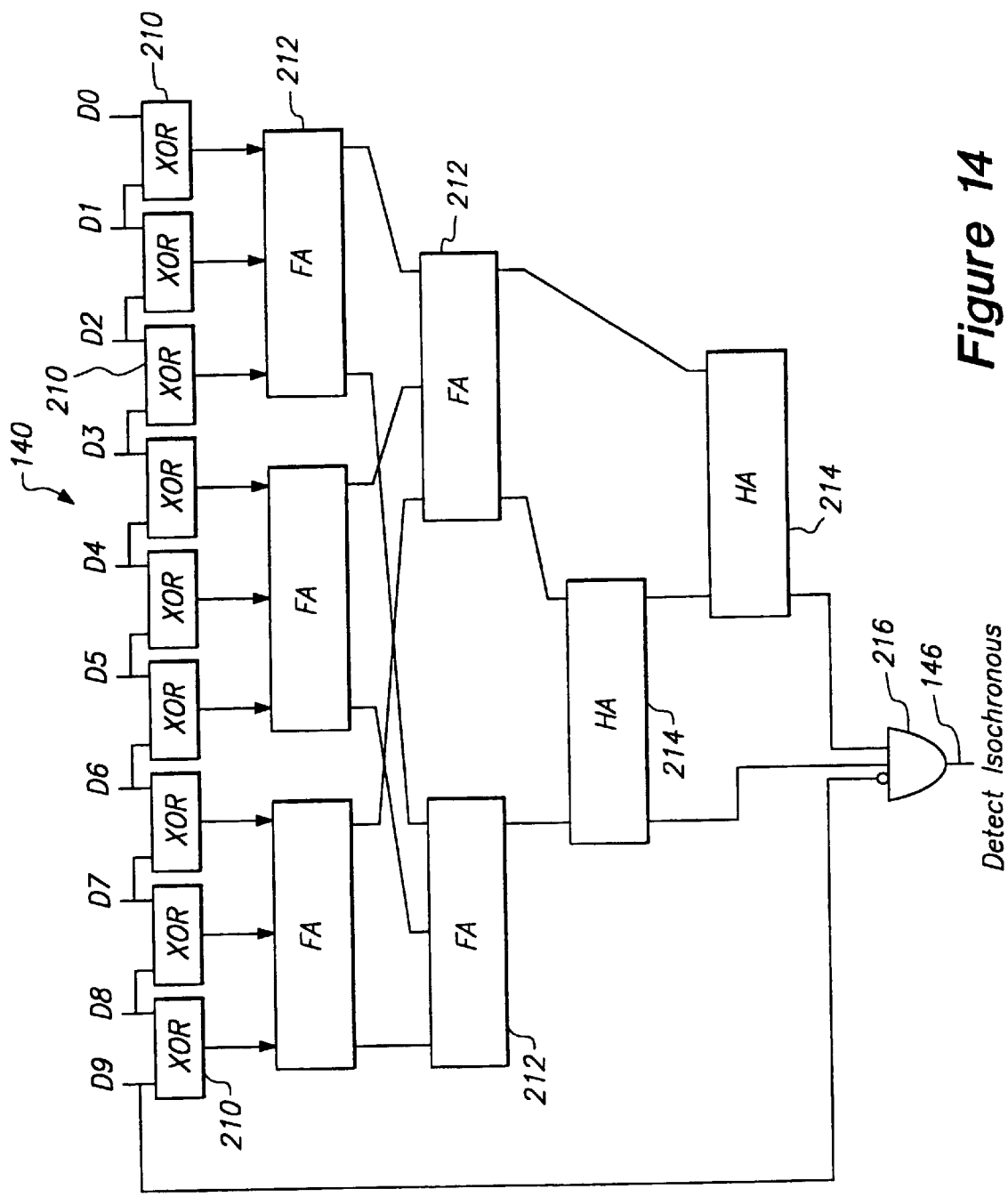
FIG. 14 is a block diagram of an exemplary embodiment of the isochronous word detector of the data selection controller according to one embodiment of the present invention.

The isochronous word detector 140 is used along with multiplexor 150 to control the movement of the selection pointer 142 downward. The isochronous word detector 140 has an input and an output, and compares the signal applied at its input to the value(s) used in the encoding scheme for isochronous data transfer words. Thus, the isochronous word detector 140 may be comprised of a plurality of comparators, each comparing the input signal to a respective isochronous data transfer word of the encoding scheme, with their outputs logically ORed together in one exemplary embodiment. The input of the isochronous word detector 140 is preferably coupled to the output of the multiplexor 150. The output of the isochronous word detector 140 is coupled via line 146 to the down control input of the selection pointer 142. Thus, whenever an isochronous data transfer word is input to the isochronous word detector 140 via multiplexor 150, the selection pointer 142 will be moved right or downward toward 1. The multiplexor 150 has its select control input coupled to signal lines 132, and selects either the output of the serial-to-parallel converter 72 or one of the buffer stages 124a, 124b as the input to the isochronous word detector 140. Yet another exemplary embodiment of the isochronous word detector 140 is shown in FIG. 14. The exemplary embodiment of the isochronous word detector 140 comprises a plurality of exclusive-OR gates 210, a plurality of adders 212, a plurality of half adders 214, and an AND gate. The plurality of exclusive-OR gates 210, a plurality of adders 212, a plurality of half adders 214, and an AND gate are coupled as shown in FIG. 14, and are used to count the number of transitions in the word input to the isochronous word detector 140, and to detect a leading 0. The encoding scheme requires that all isochronous transfer words have a 0 in the MSB position and have six transitions. Thus, the array of exclusive-OR gates 210 and staggered coupling of adders 212 and half adders 214 are used to determine whether there are six transitions in the word applied to the input of the isochronous word detector 140. The AND gate 216 adds the additional condition that the MSB of the word be 0 in order for the output of the AND gate 216 to be asserted and signal the detection of an isochronous transfer word. The output of the AND gate 216 is coupled to line 146 to signal a decrease in the position of the selection pointer 142.

Figure 15:
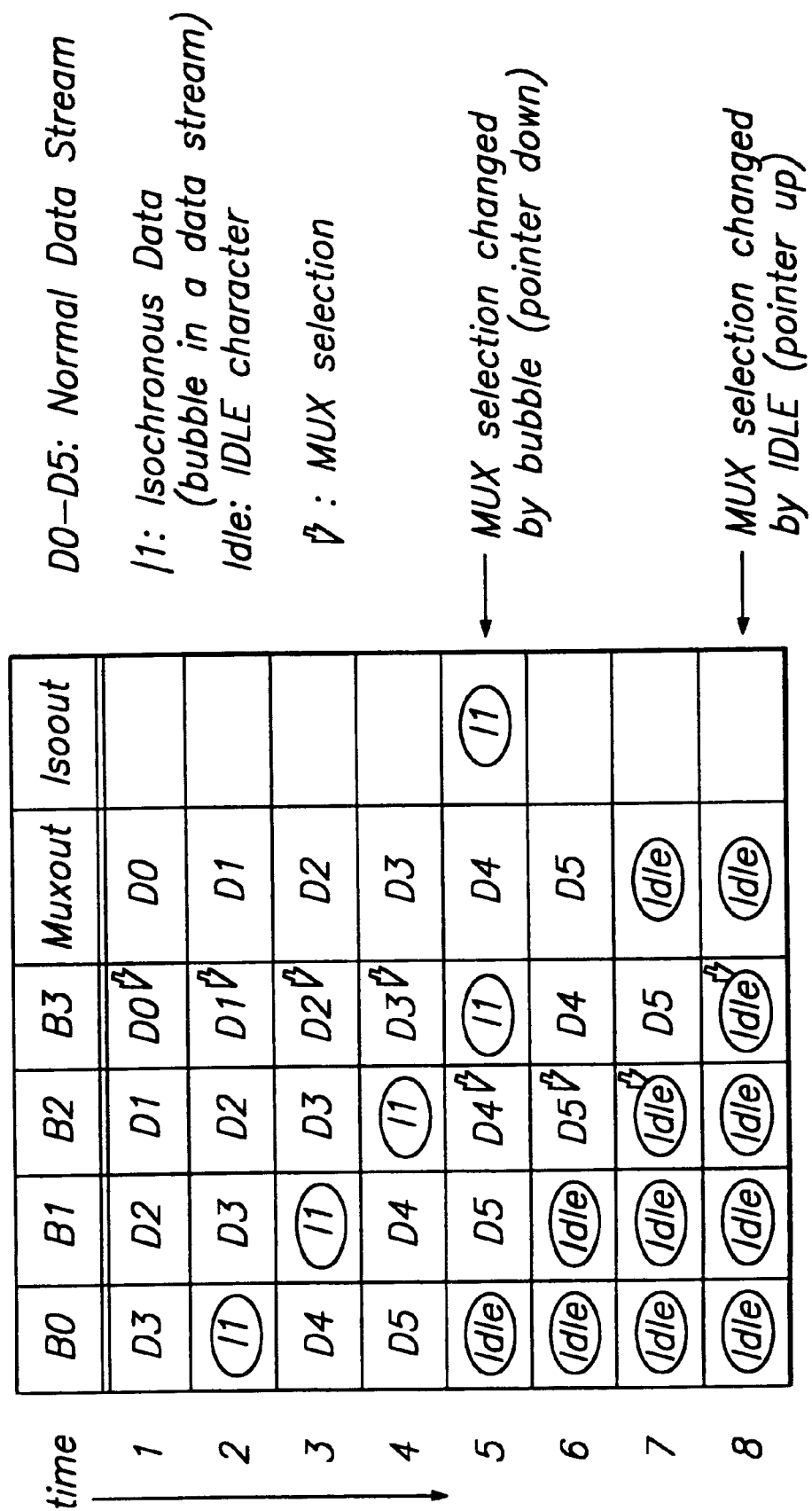
FIG. 15 is chart showing the operation of the bubble buffer of the third embodiment of the removing unit.

The operation of the bubble buffer 120 can be best be understood with reference to FIG. 15. FIG. 15 is a table showing the outputs of the serial-to-parallel converter 72 (B0), the first buffer 124a (B1), the second buffer 124b (B2), the nth buffer 124n (B3), the multiplexor 126 (Muxout), and the signal (Isoout) input to the isochronous word decoder 128 during eight successive clock cycles. FIG. 15 illustrates the situation where an isochronous data transfer word has been inserted into a normal data stream. For FIG. 15, there are 4 digital buffers, and D0–D5 are normal data stream. D0 arrives at the receiver at first and D5 at last. But after D0 an isochronous data transfer word, I1, is inserted. The selection pointer 142 doesn't change until time slot 4. The isochronous word detector 140 detects the inserted isochronous word bubble, I1, at time slot 4, and the selection pointer 142 moves to left at the next cycle. At time slot 5, the normal data and isochronous data appears at the same time; the normal data being output through the multiplexor 126 to the de-multiplexor 74, and the isochronous data being output by the nth buffer 124n to the isochronous word decoder 128. Thus, the normal data is received without a break and the isochronous data received without any timing change. At time slot 7, the idle word detector 144 receives an IDLE word from multiplexor 126 and moves the selection pointer 142 to right. After the pointer reaches its rightmost position, the pointer moves no more. A maximum N isochronous characters can be inserted and received at correct timing without making a "bubble" at normal data streams. It is notable that the selection pointer 142 can be moved N points during one cycle to insert N isochronous characters in a row.

Figure 16:
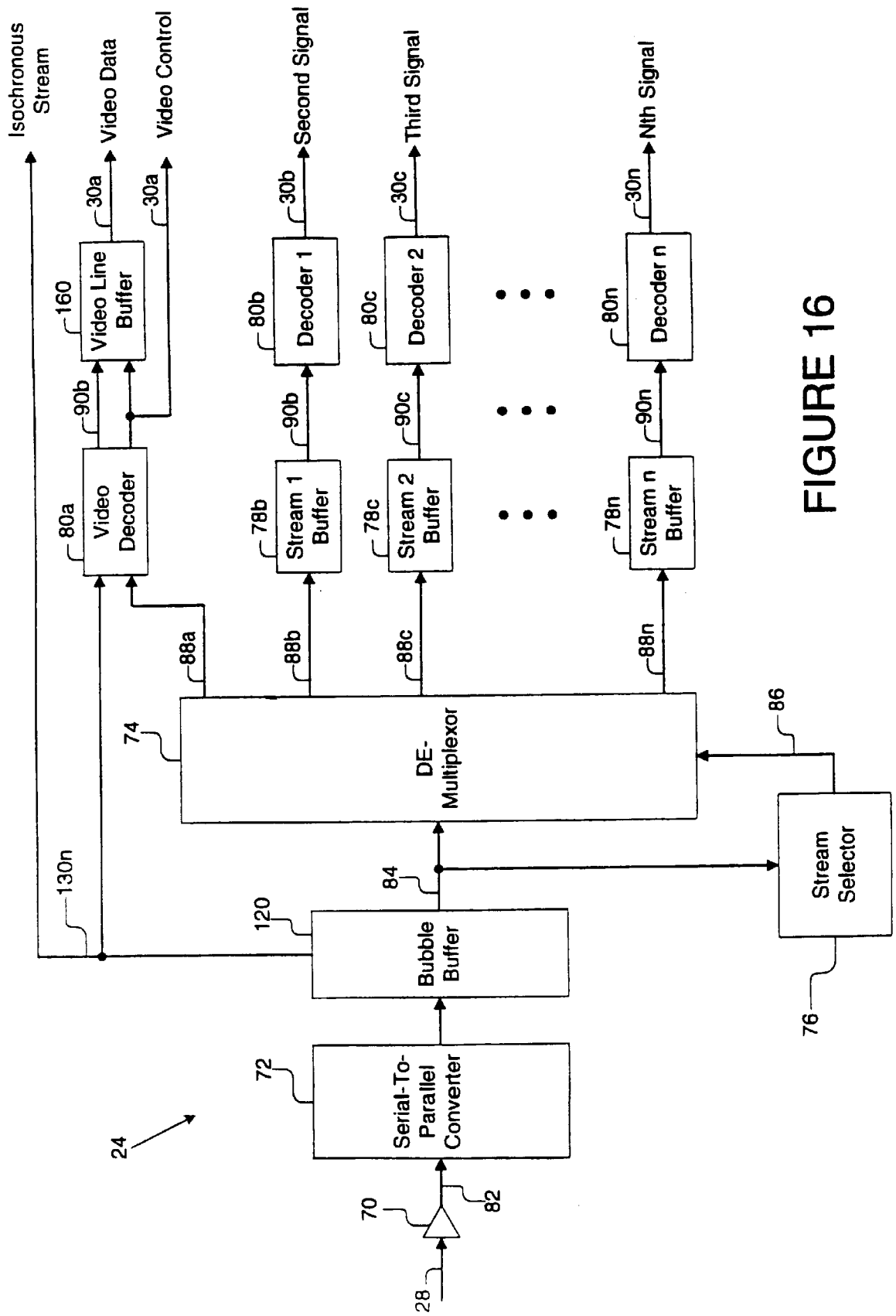
FIG. 16 is a block diagram of a third embodiment of the removing unit of the system of the present invention including a bubble buffer.
Figure 17:
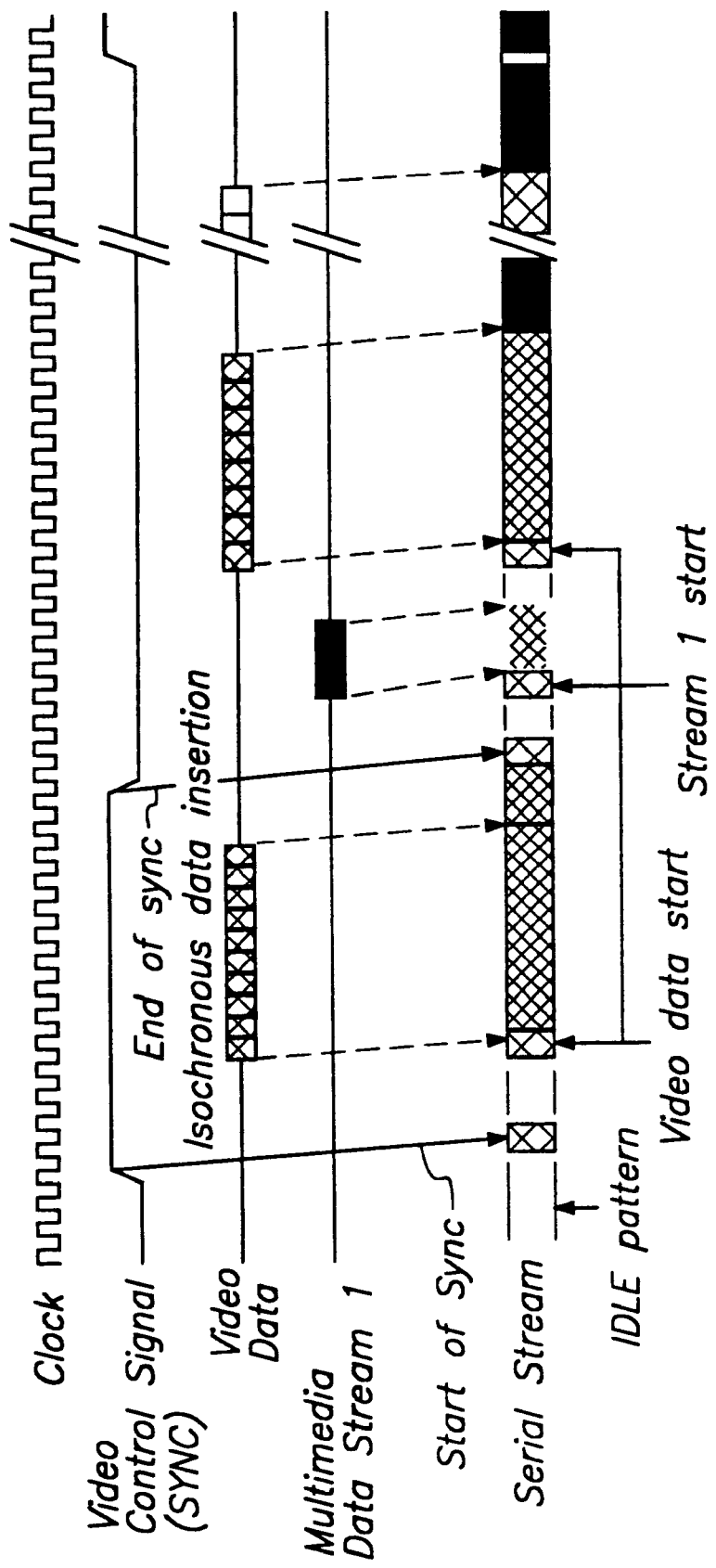
FIG. 17 is a timing diagram showing a clock signal, two stream signals, a control signal and a serial stream wherein the video refresh data has been divided into blocks.

Turning now to FIG. 16, yet another embodiment of the removing unit 24 of the present invention is shown. This fourth embodiment of the removing unit 24 is similar to the third embodiment, but further comprises a video line buffer 160. Again, like reference numbers have been used for like parts used in the above described embodiments. The fourth embodiment differs from the other embodiments in that the video line buffer 160 is coupled to the output of the video decoder 80a via line 90a. The presence and use of the video line buffer 160 allows the video refresh data to be divided into smaller groups or blocks at the embedding unit 22 without affecting the output of the video data on the removing unit 24 side. Typically, video refresh data is accessed from frame memory and sent to display continuously. The timing as to when the display data can be sent is fixed in a conventional display data transfer. However, with the addition of the line buffering of video signal, the refresh data stream can be divided into smaller chunks. This in turn makes data transfer much easier and frame access is made more flexible. Since the video data stream can be divided into smaller pieces, other multimedia data streams can be inserted with more flexibility. The fourth embodiment is also different other embodiments because the isochronous stream of control words provided by the bubble buffer 120 on line 130*n* is sent as an output, and is also provided as an input to the video decoder 80*a* along with the video data received vial line 88*a* from the de-multiplexor 74. As video data is received and decoded by the video decoder 80*a,* it is loaded into the video line buffer 160. The smaller (less than entire line) chunks or blocks of data are sent to the line buffer 160 until it is full. After a line buffer is filled, the line is sent to the digital display. This line buffering makes the dividing of the refresh video data mechanism completely transparent to the display interface. FIG. 17 shows a timing diagram of an exemplary way in which the video refresh data can be divided into two blocks, and transmitted over the serial link 28, as well as being mixed with another multimedia stream. At the removing unit 24, the first video data block sent during the period when the sync signal is asserted and the second video data block sent after multimedia data stream 1 can be recombined in the line buffer 160 to provide the video data as if there had been no division during transfer.

Figure 18A:
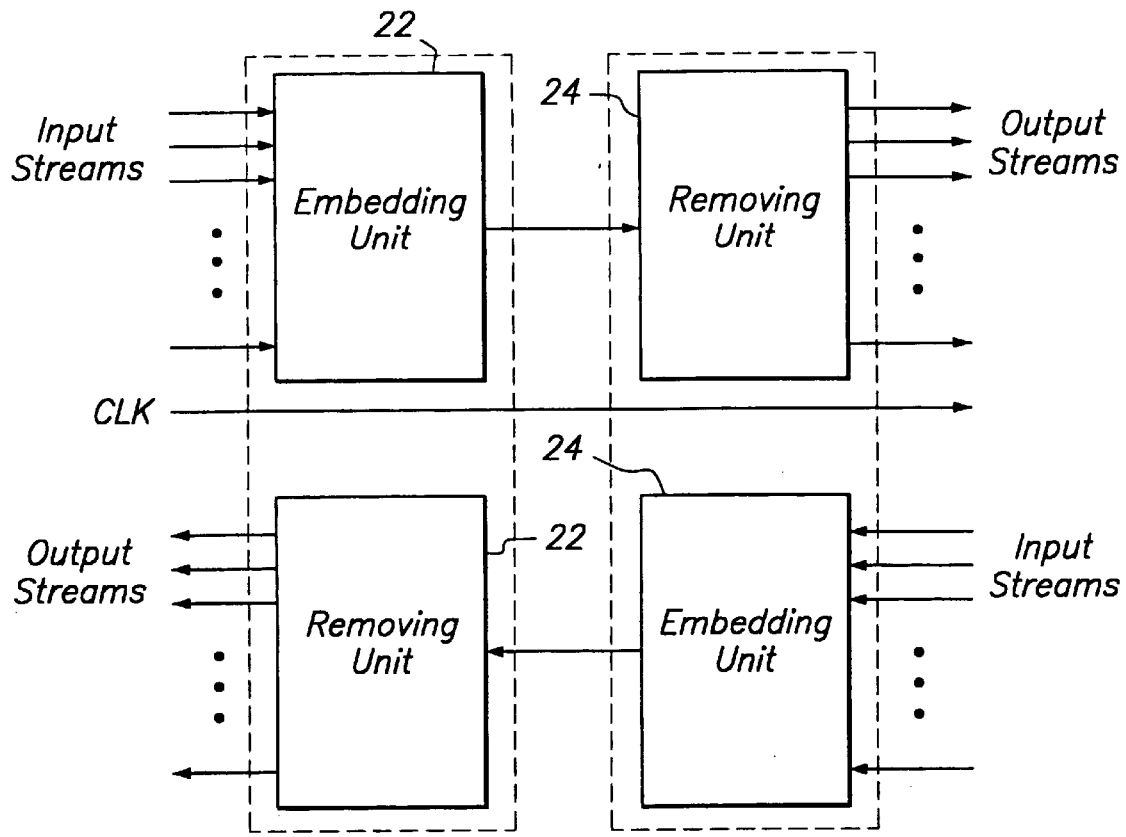
FIGS. 18A and 18B are block diagrams showing exemplary bi-directional communication system constructed using the present invention
Figure 18B:
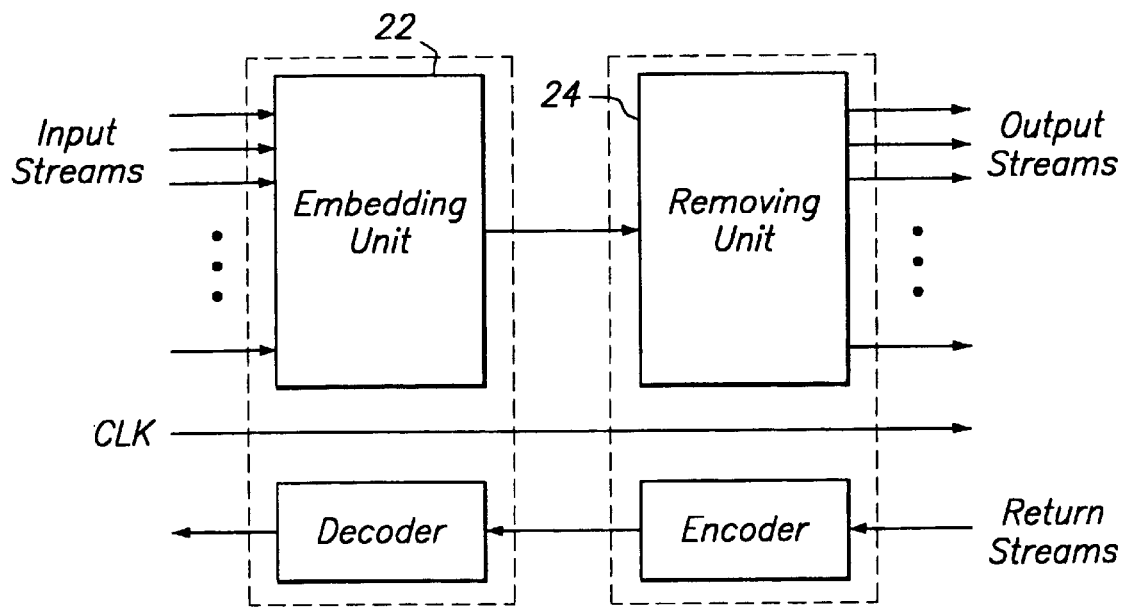

While the present invention has been described with reference to certain preferred embodiments, those skilled in the art will recognize that various modifications may be provided. For example, the present invention has been discussed above primarily in the context of a 8B/10B encoding/decoding scheme. Those skilled in the art will realize that the present invention may be applied independent of the number of bit used for encoding. Furthermore, those skilled in the art will realize that bidirectional communication systems may be constructed using multiple embedding units and removing units as shown by the examples in FIGS. 18A and 18B. These and other variations upon and modifications to the preferred embodiments are provided for by the present invention, which is limited only by the following claims.

Appendix a—Sample Control Words

Idle Words
  0101010110
  0101011010
  0101101010
  0110101010
  1010101001
  1010100101
  1010010101
  1001010101

Isochronous Data Transfer Words
  0010101110
  0010110110
  0010111010
  0011010110
  0011011010
  0011101010
  0100101110
  0100110110
  0100111010
  0101001110
  0101011100
  0101100110
  0101101100
  0101110010
  0101110100
  0110010110
  0110011010
  0110100110
  0110101100
  0110110010
  0110110100
  0111001010
  0111010010
  0111010100

Data Stream Separation Words
  1000101011
  1000101101
  1000110101
  1001001011
  1001001101
  1001010011
  1001011001
  1001100101
  1001101001
  1010001011
  1010001101
  1010010011
  1010011001
  1010100011
  1010110001
  1011000101
  1011001001
  1011010001
  1100010101
  1100100101
  1100101001
  1101000101
  1101001001
  1101010001

Link Shut Down Words
  0000000000
  1111111111

What is claimed is:

1. A system for sending multiple data signals over a serial link, the system comprising:

an embedding unit having a plurality of inputs and an output, the embedding unit encoding a plurality of input data streams to produce encoded data streams and combining the encoded data streams with isochronous control codes for encoding timing information of time critical control signals, and other control codes into a data transfer stream, wherein said isochronous control codes can be located at any position within said data transfer stream and the plurality of inputs each coupled to receive a respective data stream;

a serial link coupled to the output of the embedding unit; and a removing unit having an input and a plurality of outputs, the input of the removing unit coupled to the serial link to receive the data transfer stream from the embedding unit, the removing unit separating the data transfer stream into a plurality of separated data streams, isochronous control codes and other control codes, and decoding the separated data streams to remove the encoding applied by the embedding unit, the removing unit providing each of the decoded, separated data streams on a respective one of the plurality of outputs of the removing unit according to a value of the other control codes.

2. The system of claim 1, wherein the embedding unit further comprises:

an encoder having a plurality of inputs and a plurality of outputs, each of the plurality of inputs coupled to receive a respective data stream, the encoder receiving data words and producing encoded data words;

a multiplexor having a control input, a plurality of data inputs and a plurality of data outputs, the multiplexor selecting one of the plurality of inputs to be output as a data transfer stream, the inputs of the multiplexor coupled to the plurality of outputs of the encoder;

a parallel-to-serial converter having a plurality of inputs and an output, the plurality of inputs of the parallel-to-serial converter coupled to the outputs of the multiplexor; and a scheduler having a plurality of inputs and an output, the scheduler controlling the data stream output over the serial link, the inputs of the scheduler coupled to the outputs of the encoder, and the output of the scheduler coupled to the control input of the multiplexor.

3. The system of claim 2, wherein the embedding unit further comprises a data buffer having a plurality of inputs and a plurality of outputs, the data buffer coupled between the encoder and the multiplexor.

4. The system of claim 2, wherein the embedding unit further comprises a control code generator for producing the other control codes identifying streams the other control codes identifying when the link is idle and the isochronous control codes, the control code generator having a plurality of outputs coupled to corresponding inputs of the multiplexor.

5. The system of claim 2, wherein the encoder encodes each group of eight bits into a group of ten bits.

6. The system of claim 2, wherein the serial link is a data signal line and a clock line.

7. The system of claim 2, wherein the serial link is a plurality of data signal lines and a clock line.

8. The system of claim 2, wherein the serial link is three data signal lines and a clock line.

9. The system of claim 1, wherein the removing unit further comprises:

a converter having an input and a plurality of outputs for converting a serial stream into a data word output in parallel, the input of the converter coupled to the serial link;

a de-multiplexor having a control input, a plurality of inputs and a plurality of outputs, the plurality of outputs each providing a different stream of data, the plurality of inputs of the de-multiplexor coupled to the plurality of outputs of the converter;

a stream selector having a plurality of inputs and an output for generating a control signal indicating which one of the different streams of data to send a data word, the plurality of inputs of the stream selector coupled to the plurality of outputs of the converter, and the output of the stream selector coupled to the control input of the de-multiplexor; and a decoder having a plurality of inputs and a plurality of outputs for decoding a data word, the inputs of the decoder coupled to respective outputs of the de-multiplexor.

10. The system of claim 9, wherein the removing unit further comprises a data buffer having a plurality of inputs and a plurality of outputs, the data buffer coupled between the de-multiplexor and the decoder.

11. The system of claim 9, wherein the decoder decodes each data word having ten bits into a group of eight bits.

12. The system of claim 9, wherein the stream selector further comprises a plurality of comparators, each comparator coupled to receive the data word from the converter and a respective stream start control word.

13. The system of claim 9, wherein the removing unit further comprises a word aligner having a plurality of inputs and a plurality of outputs, the word aligner coupled between the converter and the de-multiplexor, the word aligner using idle words in the data stream and shifting the data bit-wise for word alignment.

14. The system of claim 9, wherein the removing unit further comprises an n-stage bubble buffer for storing data words output by the converter, the n-stage bubble buffer having a plurality of inputs and a plurality of outputs, the n-stage bubble buffer coupled between the converter and the de-multiplexor, the n-stage bubble buffer separating the isochronous control codes from a data stream output to the de-multiplexor.

15. The system of claim 1, wherein the serial link includes a first data signal line, a second data signal line and a clock line, the first data signal line and the clock line coupled to the embedding unit and the removing unit, and wherein the system further comprises:

an encoder having an input and an output, the input of the encoder coupled to receive a return data stream, the encoder producing encoded data words from the return data stream, the output of the encoder coupled to the second data signal line; and a decoder having an input and an output, the input of the decoder coupled to the second data signal line, the decoder producing a data stream from the encoded data words.

16. The system of claim 1, wherein the serial link includes a first data signal line, a second data signal line and a clock line, the first data signal line and the clock line coupled to the embedding unit and the removing unit, and wherein the system further comprises:

a second embedding unit having a plurality of inputs and an output, the second embedding unit encoding a plurality of input data streams to produce encoded data streams and combining the encoded data streams into a return data transfer stream, the plurality of inputs of the second embedding unit each coupled to receive a respective data stream, and the output of the second embedding unit coupled to the second data signal line; and a second removing unit having an input and a plurality of outputs, the input of the second removing unit coupled to the second data signal line to receive the return data transfer stream from the second embedding unit, the second removing unit separating the return data transfer stream into a plurality of separated data streams and decoding the separated data streams to remove the encoding applied by the second embedding unit, the second removing unit providing each of the decoded, separated data streams on a respective one of the plurality of outputs of the second removing unit.

17. An apparatus for receiving a data stream and generating a plurality of data streams, the apparatus comprising:

a de-multiplexor having a control input, a plurality of data inputs and a first and second plurality of outputs, each of the first and second plurality of outputs providing a different stream of data, the plurality of data inputs of the de-multiplexor coupled to receive a data stream having a plurality of data words;

a stream selector having an input and an output for generating a control signal indicating an output of the de-multiplexor to which to send a data word, the input of the stream selector coupled to the data input of the de-multiplexor, and the output of the stream selector coupled to the control input of the de-multiplexor; and a decoder having a plurality of inputs and a plurality of outputs for decoding data words, the plurality of inputs of the decoder coupled to respective one of the plurality of outputs of the de-multiplexor; and an isochronous decoder having an inputs and a plurality of outputs for decoding isochronous control codes into timing control signals, the input of the isochronous decoder coupled to the data input of the de-multiplexor, wherein said isochronous control codes can be located at any position within the data stream.

18. The apparatus of claim 17 further comprising a converter having an input and a plurality of outputs for converting a serial stream into the data stream having a plurality of data words output in parallel, the input of the converter coupled to a serial link, the plurality of outputs of the converter coupled to the plurality of input of the de-multiplexor.

19. The apparatus of claim 17 further comprising a data buffer for storing data, the data buffer having a plurality of inputs and a plurality of outputs, the data buffer coupled to the de-multiplexor and the decoder.

20. The apparatus of claim 19, wherein the data buffer comprises a plurality of dedicated buffers, each of the dedicated buffers having an input and an output, each of the dedicated buffers having storing an encoded data stream output by the de-multiplexor, and each of the dedicated buffers coupled to a respective one of the plurality of outputs of the de-multiplexor and a respective one of the plurality of inputs of the decoder.

21. The apparatus of claim 17, wherein the decoder decodes each group of ten bits into a group of eight bits.

22. The apparatus of claim 17, wherein the decoder further comprises a plurality of dedicated decoders, each of the dedicated decoders having an input and an output, the input of each dedicated decoder coupled to receive a respective data stream from the de-multiplexor.

23. The apparatus of claim 22, wherein each of the dedicated decoders decodes encoded words of the respective data stream into one from the group of data signals and control signals.

24. The apparatus of claim 22, wherein the at least one of the plurality of dedicated decoders decodes an encoded word of the respective data stream into a combination of data signals and control signals.

25. A method for transmitting a plurality of data streams over a signal line comprising the steps of:

receiving a first data stream and a second data stream;

encoding the first and second data streams into coded words;

transmitting a first start control code over the signal line;

transmitting the encoded words of the first data stream over the signal line;

transmitting a second start control code over the signal line;

transmitting the encoded words of the second data stream over the signal line; and responding to an assertion of a time critical control signal by:

generating an isochronous control code word for encoding timing information from said time critical control signal; and transmitting the isochronous control code word over the signal line, wherein said isochronous control code word can be located at any position within a data stream transmitted over the signal line.

26. The method of claim 25 further comprising the step of transmitting a third control code over the signal line, the third control code indicating a discontinuation of communication over the line.

27. The method of claim 25 further comprising the step of sending a first special code word when the first control code, coded words from the first data stream, the second control code, and coded words from the second data stream are not being transmitted over the signal line.

28. The method of claim 25 wherein the step of transmitting the isochronous control code word further comprising the steps of:

determining whether one from the group of the first control code, the encoded words of the first data stream, the second control code, and the encoded words of the second data stream are being transmitted over the signal line;

interrupting transmission if one from the group of the first control code, the encoded words of the first data stream, the second control code, and the encoded words of the second data stream are being transmitted over the signal line;

transmitting the isochronous control code word over the signal line; and resuming transmission if one from the group of the first control code, the encoded words of the first data stream, the second control code, and the encoded words of the second data stream are being transmitted over the signal line.

29. The method of claim 25 further comprising the step of storing the encoded second data streams while the first control code and first encoded second data streams are transmitted over the signal line.

30. The method of claim 25 further comprising the step of determining a priority between transmitting the encoded first data stream and the encoded second data stream, and transmitting the encoded data stream with a highest priority first.

31. The method of claim 25 wherein the steps of transmitting include converting words into a serial stream of bits and sequentially asserting each bit on the signal line.

32. A method for generating a plurality of data streams from a serial sequence, wherein an isochronous control code for encoding timing information of time critical control signals can be located at any position within said serial sequence, the method comprising the steps of:

converting a serial sequence of bits into a word;

determining whether the word is the isochronous control code;

if the word is the isochronous control code, generating a time critical control signal; and if the word is not the isochronous control code,
selecting a stream path using the word;
transmitting the word on the selected stream path; and
decoding the word to produced an output word.

33. The method of claim 32 wherein the step of converting the serial sequence further comprises the step of word aligning the converted serial sequence.

34. The method of claim 33 wherein the step of word aligning the converted serial sequence, comprises the steps of:

receiving a first word:

receiving a second word;

receiving a third word;

shifting the first, second and third words to produced a properly aligned word by detecting an idle word pattern in a concatenation of the first, second and third words.

35. The method of claim 32 wherein the step of selecting a stream path further comprises the steps of:

comparing the word to a set of predetermined control characters; and selecting a stream path associated with the one of the set of predetermined control characters that the word matches.

36. The method of claim 32 further comprising the step of storing the word after the step of transmitting the word on the selected stream path and before the step of decoding the word to produced an output word.

37. The method of claim 32 wherein the step of decoding converts the word from a 10-bit value to an eight bit value.

38. The method of claim 32 further comprising the steps of:

storing the word before the step of transmitting the word on the selected stream path;

providing access to stored word; and decoding the word if the word is an isochronous control code word.

* * * * *